(12) United States Patent
Takahashi et al.

(10) Patent No.: US 7,750,365 B2
(45) Date of Patent: Jul. 6, 2010

(54) INSULATED GATE BIPOLAR TRANSISTOR WITH BUILT-IN FREEWHEELING DIODE

(75) Inventors: Hideki Takahashi, Tokyo (JP); Shinji Aono, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/099,599

(22) Filed: Apr. 8, 2008

(65) Prior Publication Data

US 2008/0258172 A1    Oct. 23, 2008

Related U.S. Application Data

(62) Division of application No. 10/826,391, filed on Apr. 19, 2004, now abandoned.

(30) Foreign Application Priority Data

Jul. 24, 2003   (JP)  ............................. 2003-279054
Jan. 29, 2004   (JP)  ............................. 2004-021294

(51) Int. Cl.
*H01L 29/739* (2006.01)
(52) U.S. Cl. ............................... 257/139; 257/E29.123
(58) Field of Classification Search ................. 257/328, 257/134–139, E29.123
See application file for complete search history.

(56) References Cited

U.S. PATENT DOCUMENTS

| 4,893,165 A | 1/1990 | Miller et al. |
| 5,086,324 A | 2/1992 | Hagino |
| 5,270,230 A | 12/1993 | Sakurai |
| 5,751,024 A | 5/1998 | Takahashi |
| 5,801,408 A | 9/1998 | Takahashi |
| 5,864,159 A | 1/1999 | Takahashi |

(Continued)

FOREIGN PATENT DOCUMENTS

DE    102 50 575 A1    5/2004

(Continued)

OTHER PUBLICATIONS

Akiyama et al., "Effects of Shorted Collector On Characteristics of IGBTs", 1990.*

(Continued)

*Primary Examiner*—Nathan W Ha
(74) *Attorney, Agent, or Firm*—Oblon, Spivak, McClelland, Maier & Neustadt, L.L.P.

(57) ABSTRACT

An insulated gate bipolar transistor includes a first main electrode on a first main surface and in contact with a base region of an insulated gate transistor at the first main surface, a first semiconductor layer of a first conductivity type on a second main surface, a second semiconductor layer of a second conductivity type on the second main surface and vertically aligned with a region of the first main electrode in contact with the base region, and a second main electrode formed on the first and second semiconductor layers. An interface between the second main electrode and each of the first and second semiconductor layers is parallel to the first main surface, a distance between the first main surface and the interface is equal to 200 μm or smaller, and a thickness of each of the first and second semiconductor layers is equal to 2 μm or smaller.

2 Claims, 34 Drawing Sheets

U.S. PATENT DOCUMENTS

| | | | |
|---|---|---|---|
| 5,981,981 | A | 11/1999 | Takahashi |
| 6,008,518 | A | 12/1999 | Takahashi |
| 6,040,599 | A | 3/2000 | Takahashi |
| 6,107,650 | A | 8/2000 | Takahashi et al. |
| 6,118,150 | A | 9/2000 | Takahashi |
| 6,198,130 | B1 | 3/2001 | Nobuto et al. |
| 6,221,721 | B1 | 4/2001 | Takahashi |
| 6,259,123 | B1 | 7/2001 | Kelberlau et al. |
| 6,323,508 | B1 | 11/2001 | Takahashi et al. |
| 6,331,466 | B1 | 12/2001 | Takahashi et al. |
| 6,472,693 | B1 | 10/2002 | Takahashi et al. |
| 6,734,497 | B2 | 5/2004 | Takahashi et al. |
| 6,768,168 | B1 | 7/2004 | Takahashi |
| 6,781,199 | B2 | 8/2004 | Takahashi |
| 6,798,040 | B2 * | 9/2004 | Reznik ........................ 257/565 |
| RE38,953 | E | 1/2006 | Takahashi |
| 7,154,145 | B2 | 12/2006 | Takahashi |
| 2001/0040255 | A1 * | 11/2001 | Tanaka ........................ 257/342 |
| 2002/0048855 | A1 | 4/2002 | Matsudai et al. |
| 2004/0144992 | A1 | 7/2004 | Willmeroth et al. |
| 2007/0069287 | A1 | 3/2007 | Takahashi |
| 2008/0048295 | A1 | 2/2008 | Takahashi |

FOREIGN PATENT DOCUMENTS

| | | |
|---|---|---|
| EP | 0 330 122 B1 | 10/1995 |
| EP | 0 795 911 A2 | 9/1997 |
| EP | 0 969 501 A1 | 1/2000 |
| JP | 2-126682 | 5/1990 |
| JP | 6-53511 | 2/1994 |
| JP | 6-196705 | 7/1994 |
| JP | 7-153942 | 6/1995 |
| JP | 8-116056 | 5/1996 |
| JP | 2001-326353 | 11/2001 |
| KR | 2001-0106231 | 11/2001 |

OTHER PUBLICATIONS

Akiyama et al., "Effects of Shorted Collector on Characteristics of IGBTs", 1990.

* cited by examiner

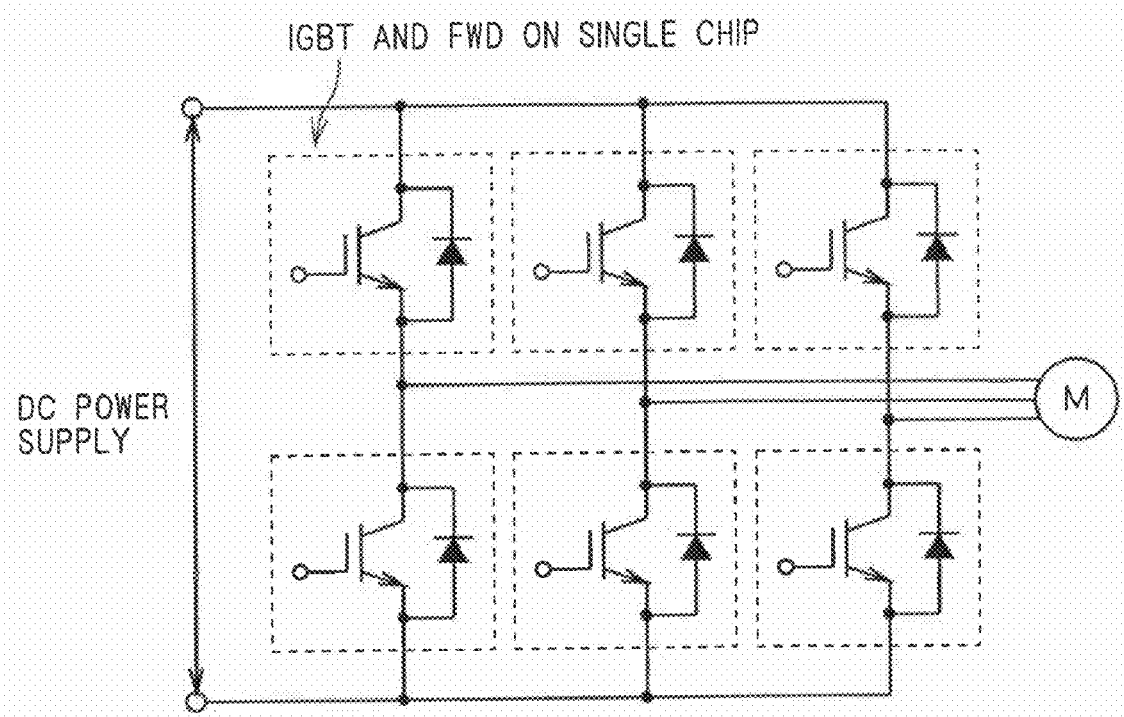

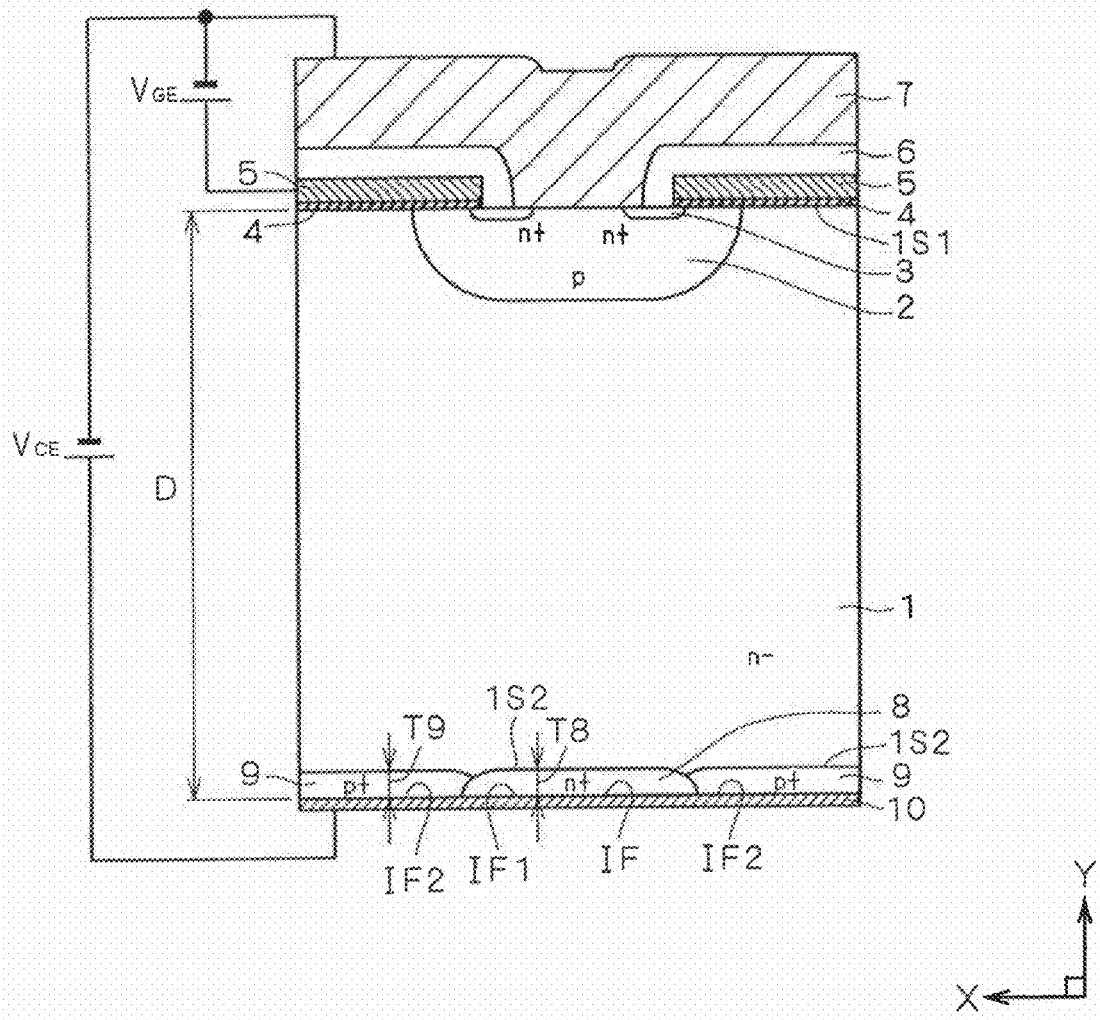

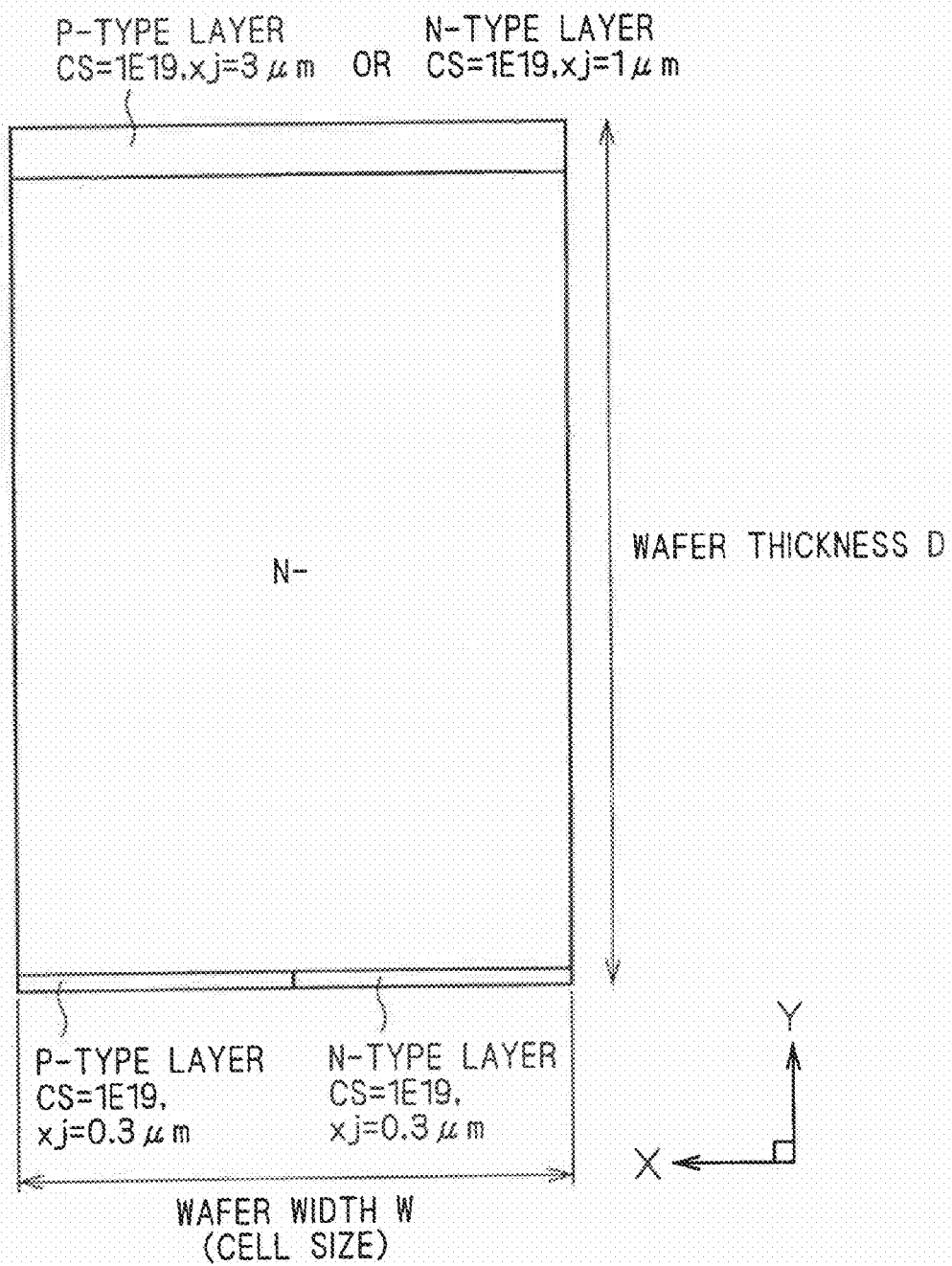

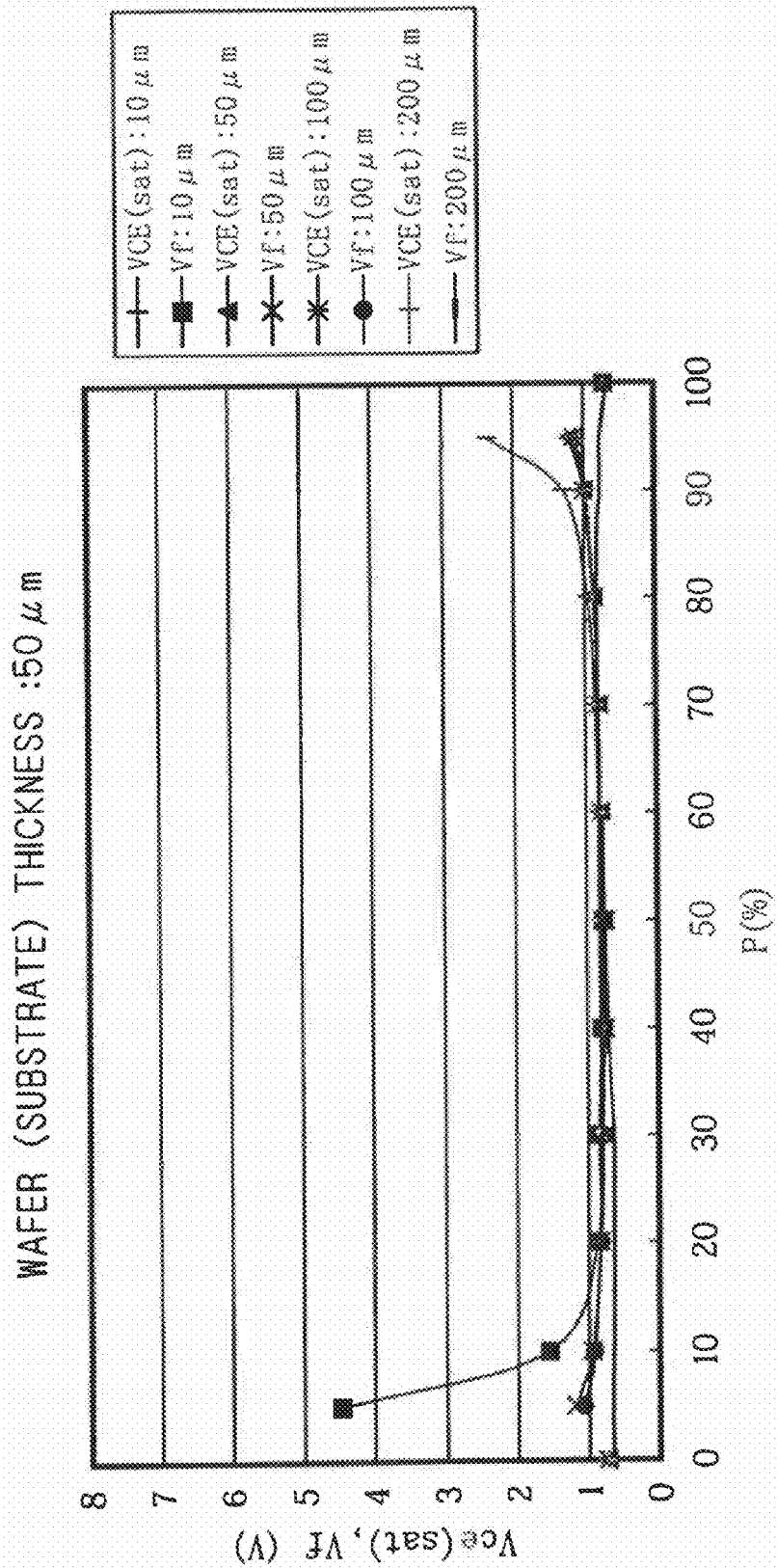

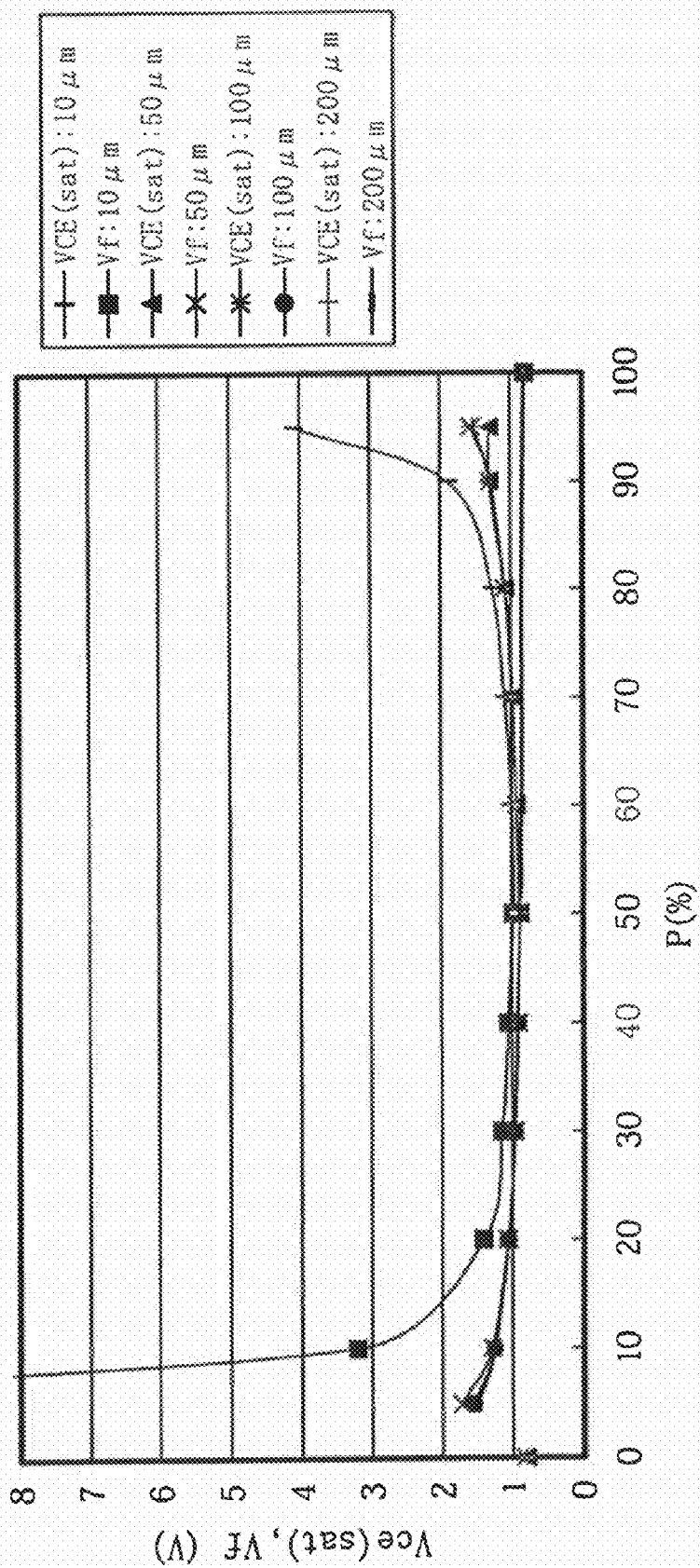

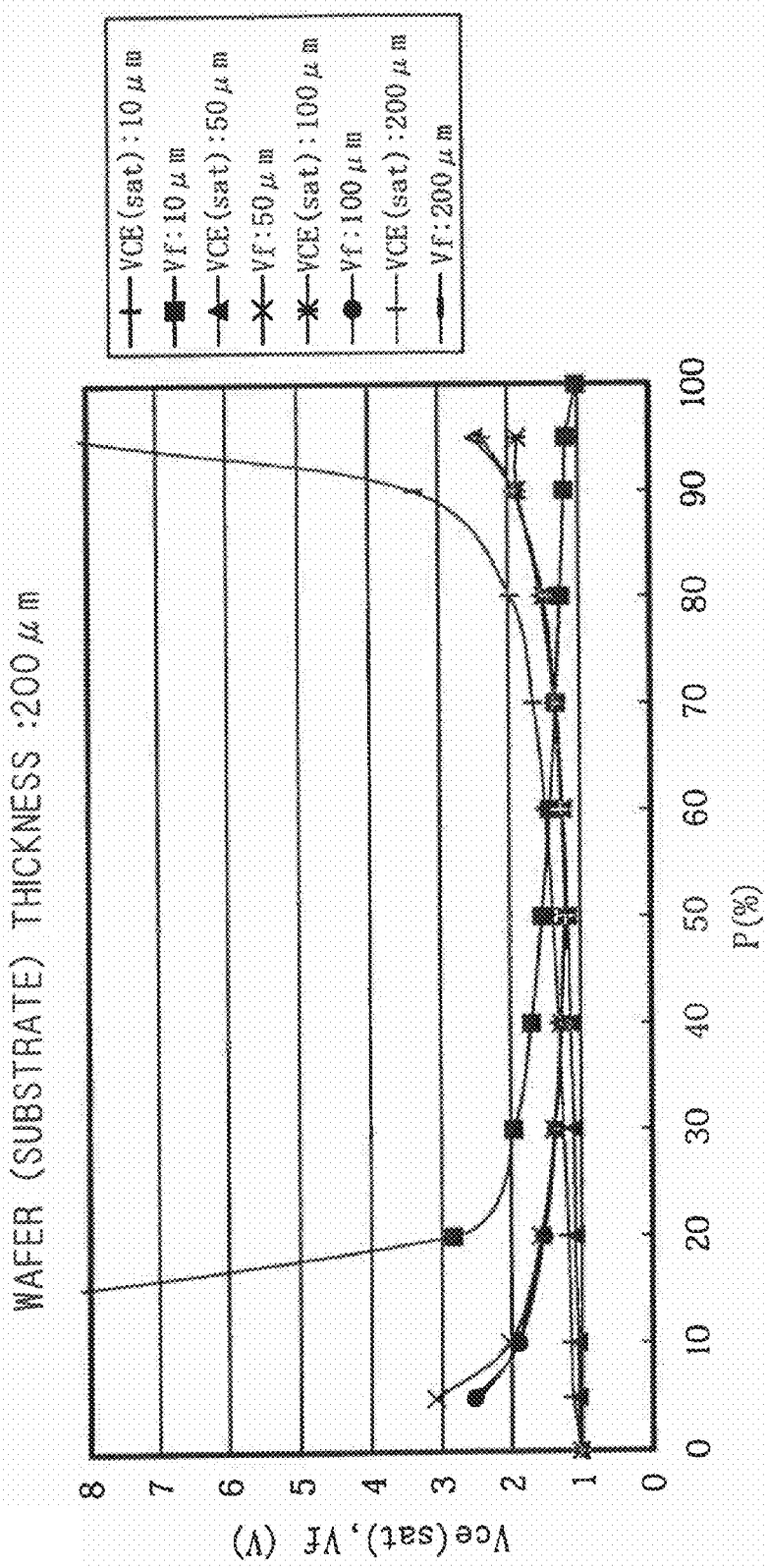

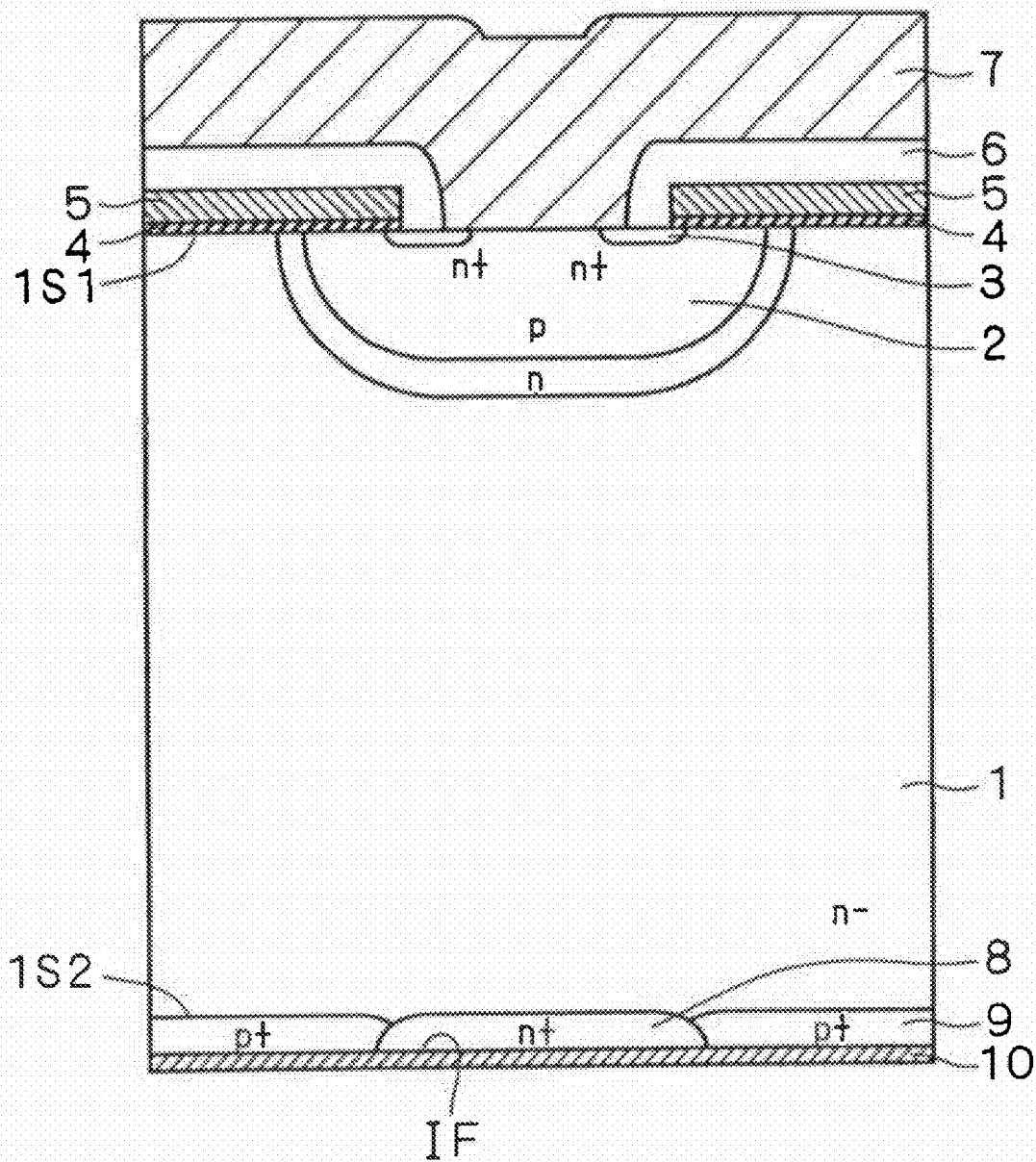

F I G . 1 5
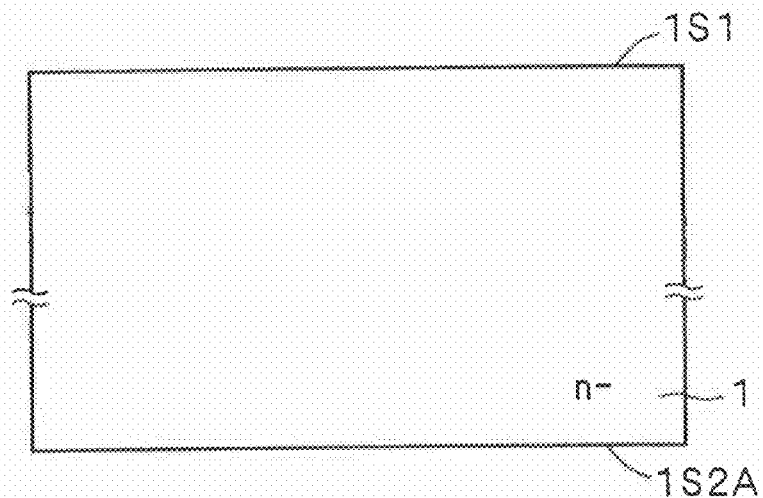
F I G . 1 6
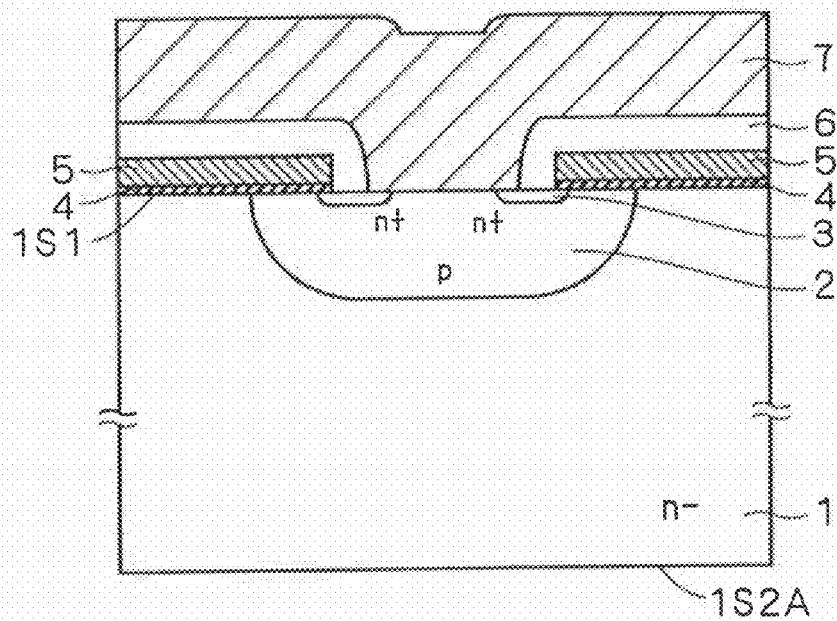

F I G . 2 1
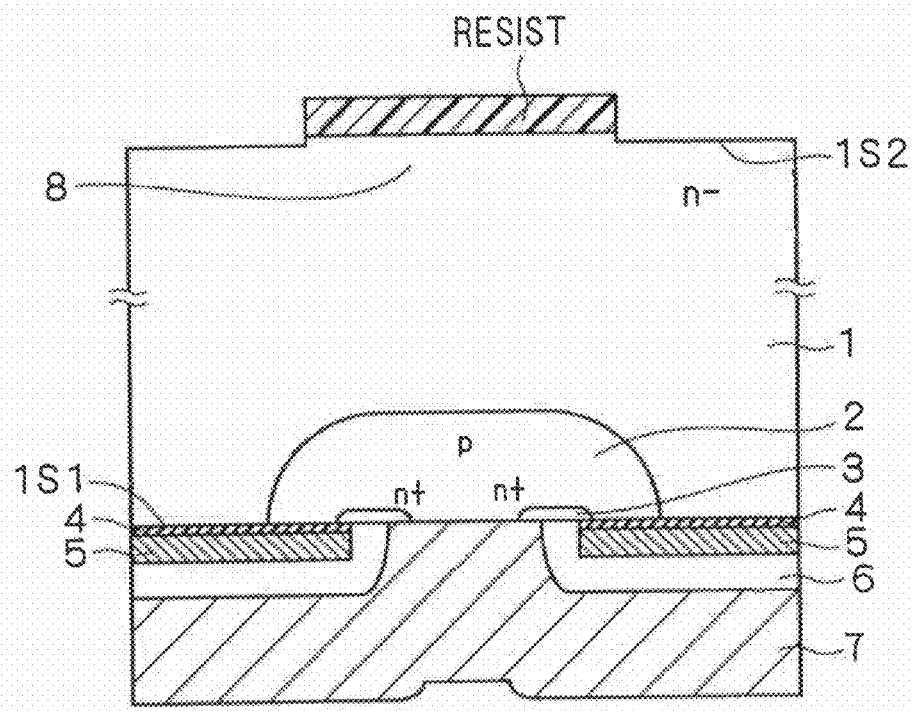
F I G . 2 2
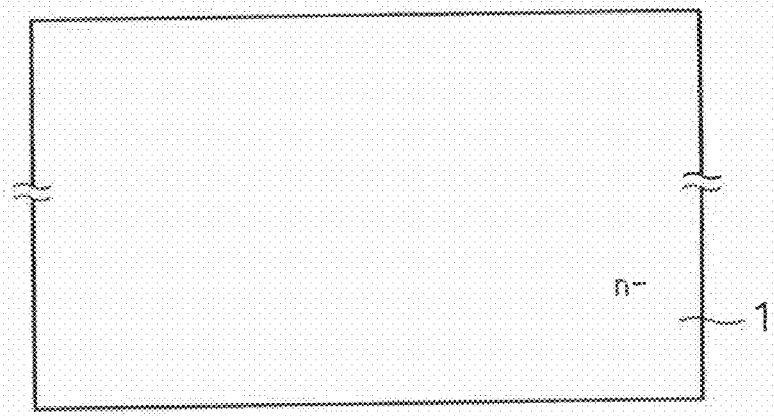

F I G . 2 3
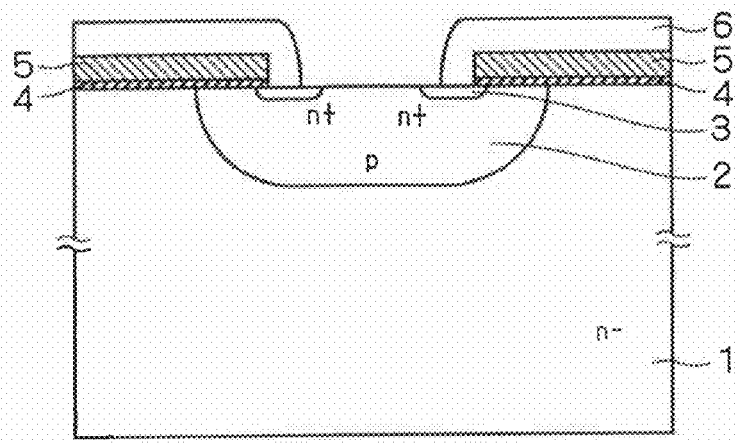
F I G . 2 4
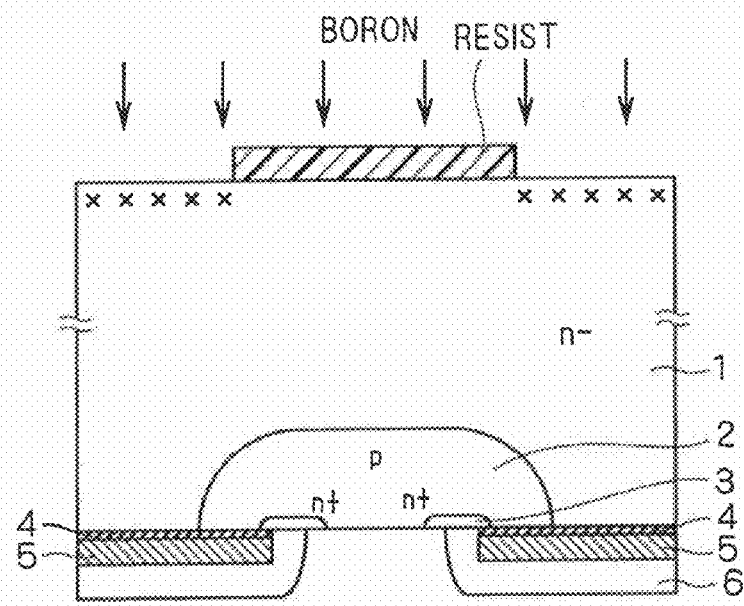

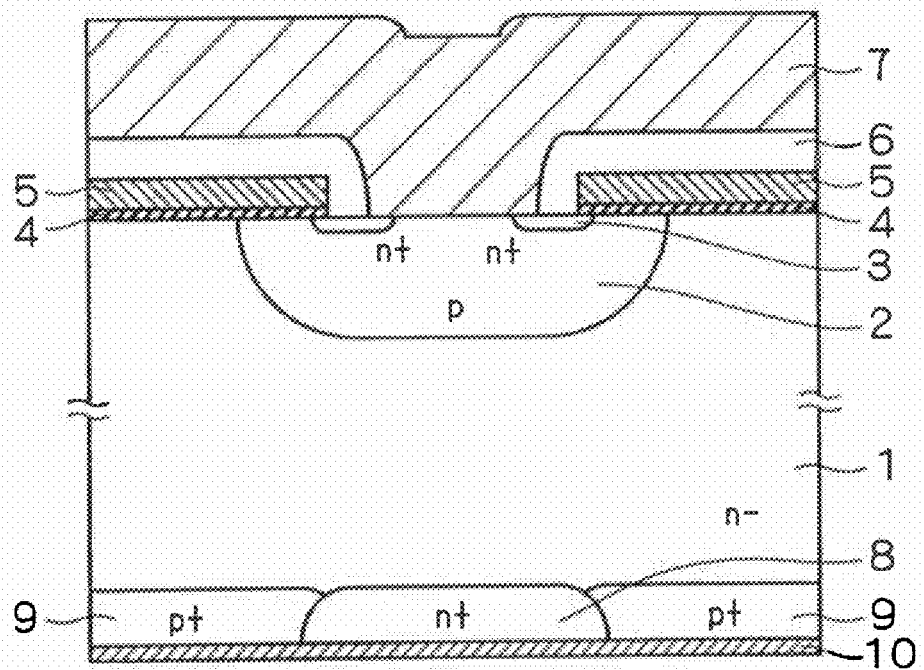

F I G. 2 8
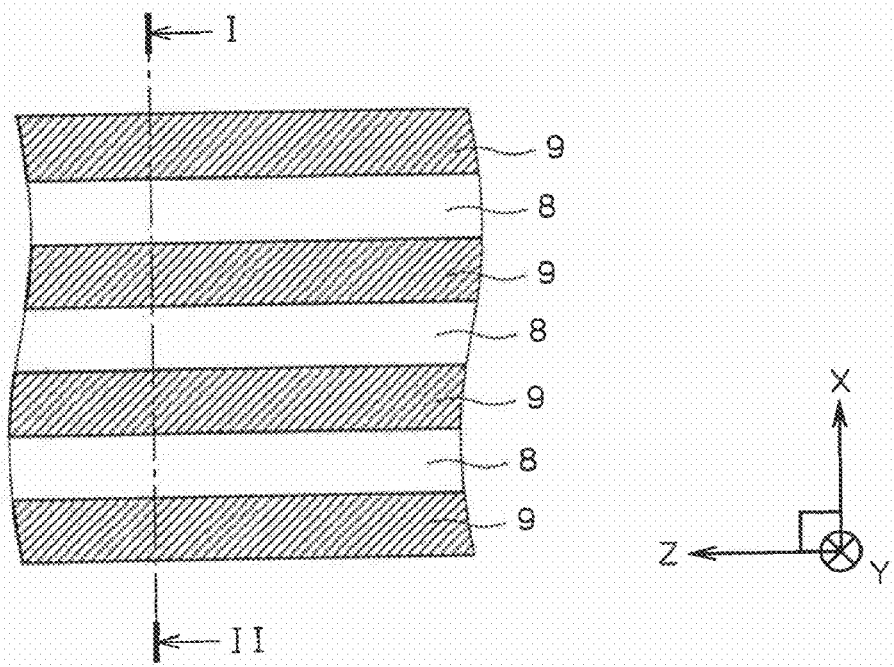
F I G. 2 9
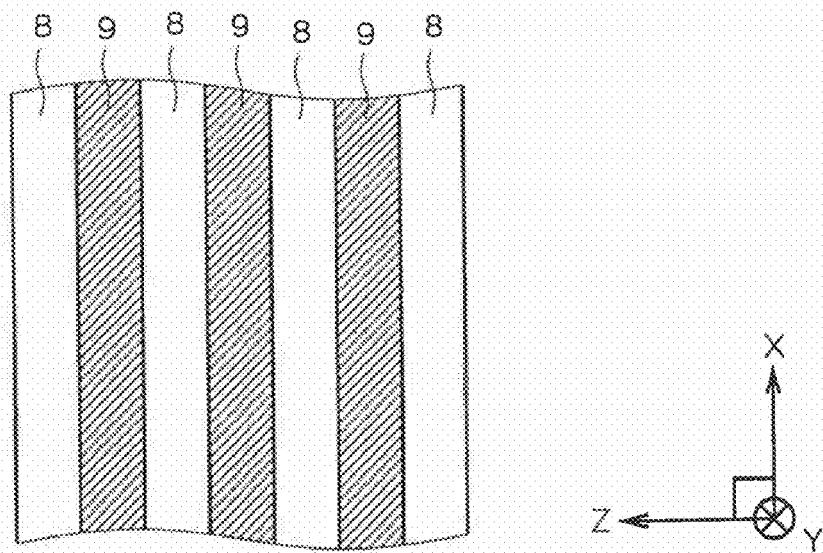

F I G . 3 2
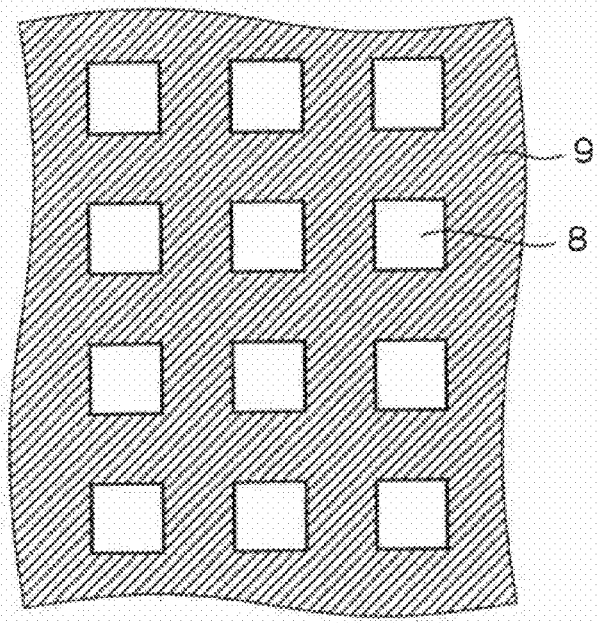
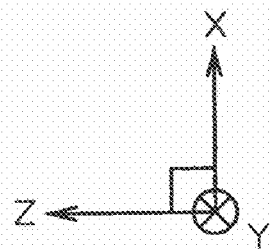
F I G . 3 3
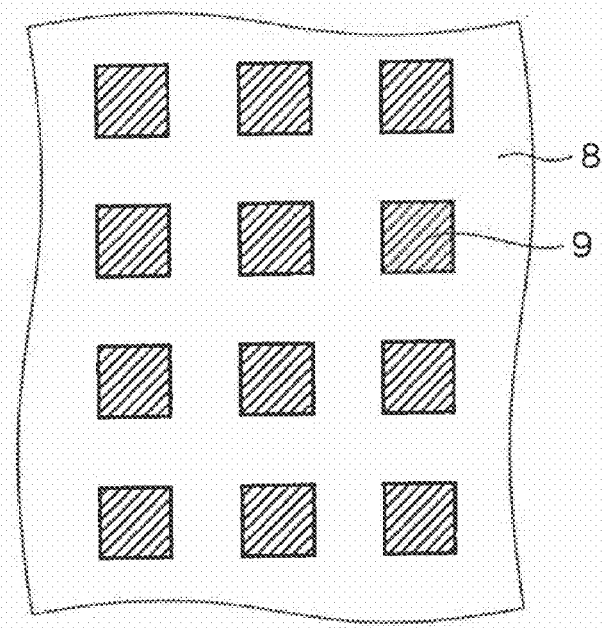
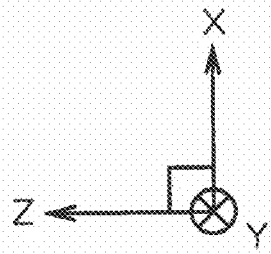

F I G. 3 6
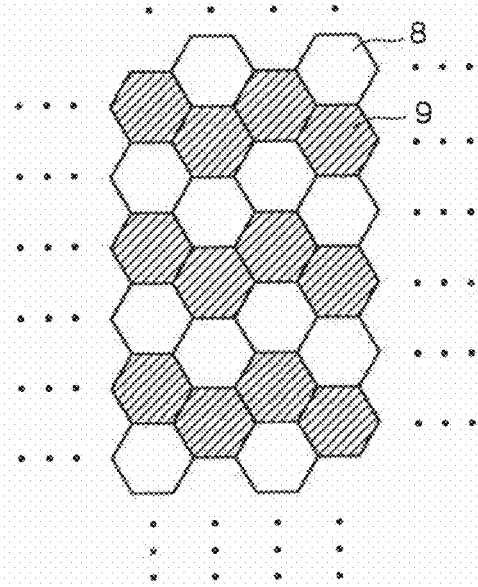
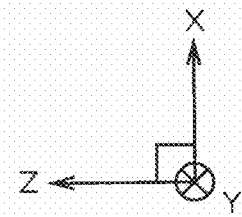
F I G. 3 7
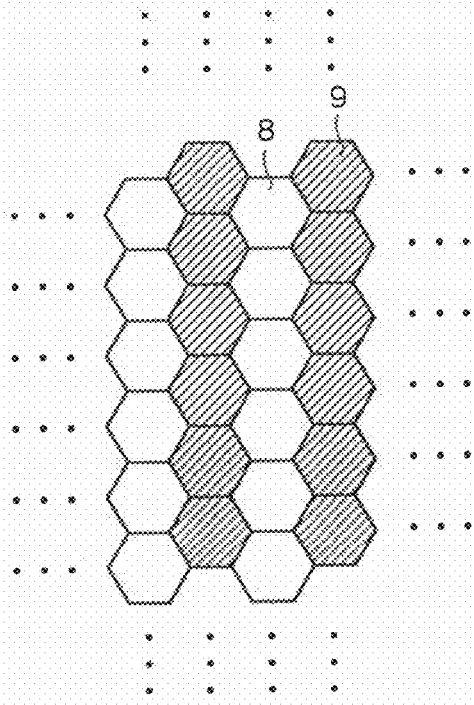
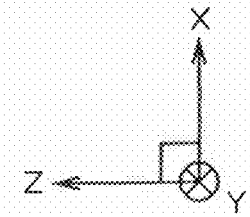

FIG. 42
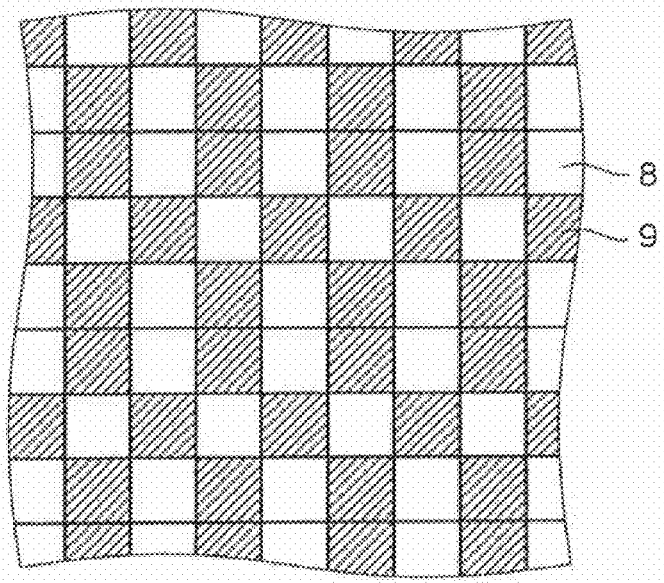
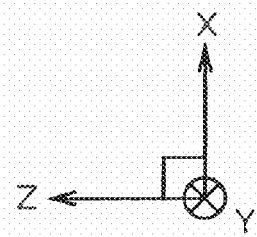
FIG. 43
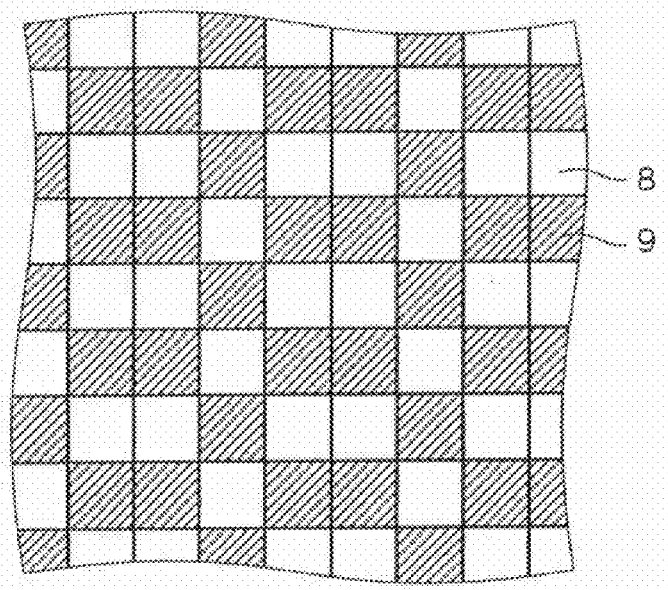
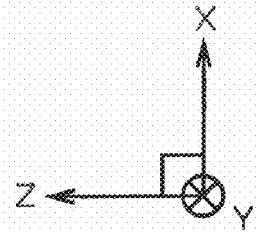

FIG. 44
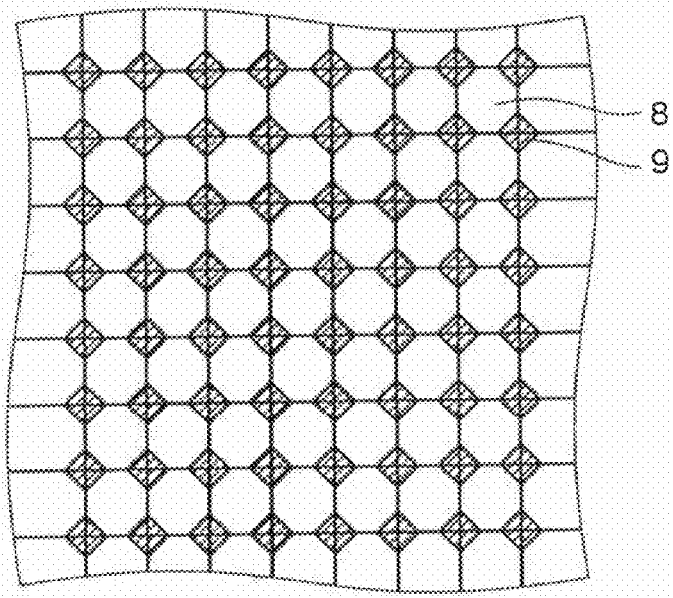
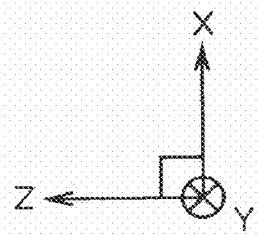
FIG. 45
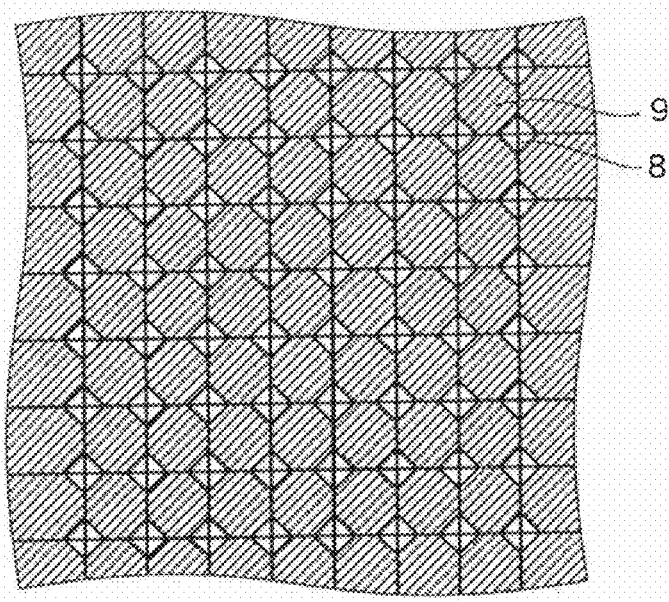
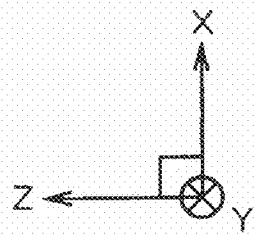

F I G . 5 0
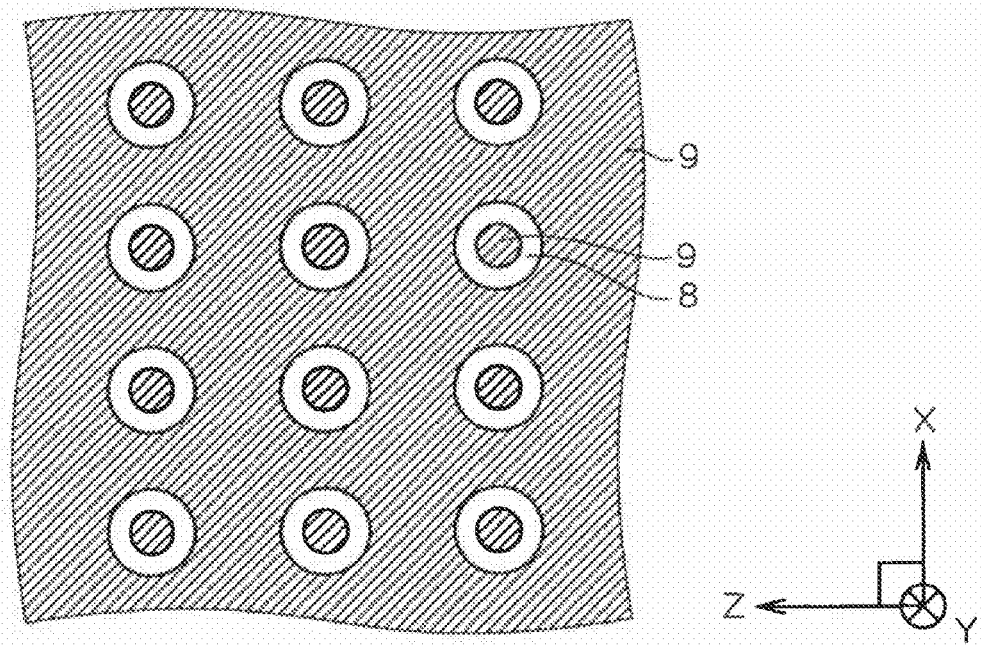
F I G . 5 1
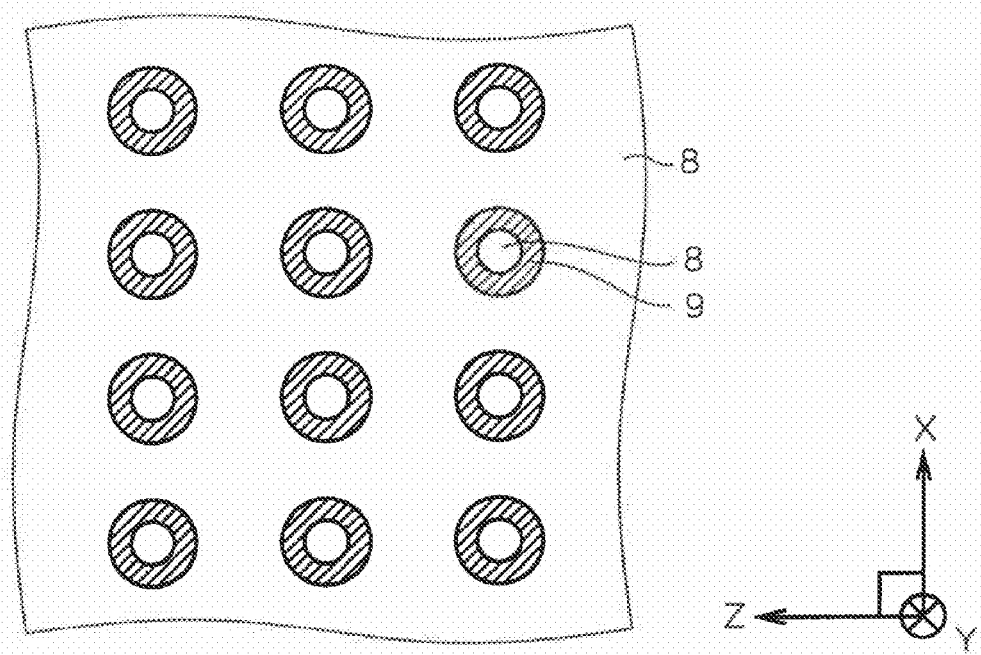

INSULATED GATE BIPOLAR TRANSISTOR WITH BUILT-IN FREEWHEELING DIODE

CROSS-REFERENCE TO RELATED APPLICATIONS

This application is a Divisional of U.S. patent application Ser. No. 10/826,391, filed Apr. 19, 2004, and claims priority to Japanese Patent Applications No. 2003-279054, filed Jul. 24, 2003, and No. 2004-021294, filed Jan. 29, 2004. The entire contents of U.S. patent application Ser. No. 10/826,391 is incorporated herein by reference.

BACKGROUND OF THE INVENTION

1. Field of the Invention

The present invention relates to a bipolar transistor including an insulated gate (MOS structure), and more particularly to a structure of an insulated gate bipolar transistor (which will hereinafter be abbreviated as an "IGBT", and may be also referred to as a "reverse conducting IGBT" in general) including a built-in freewheeling diode (which will hereinafter be also abbreviated as a "FWD"), and a technique for manufacturing the same. The IGBT according to the present invention can be used as a switching device with a built-in FWD in an inverter circuit for driving a load such as a motor, for industrial purposes.

2. Description of the Background Art

In power electronics for driving a motor or the like, under a condition that a rated voltage is 300V or higher, an IGBT is usually used as a switching device because of its characteristics. In using an IGBT as a switching device, a freewheeling diode (FWD) which is connected in parallel with the switching device is also used.

In a typical IGBT developed in the conventional art, an $N^+$-type buffer layer is formed on a $P^+$-type collector layer, an $N^-$-type layer is formed on the $N^+$-buffer layer. Also, a P-type base region is selectively formed on a surface of the $N^-$-type layer as a result of diffusion of P-type impurities. Further, a source region is formed on a surface of the P-type base region as a result of selective diffusion of a high concentration of N-type impurities. The P-type base region and the source region are formed using a polysilicon gate as a mask. Because of inclusion of an area including the P-type region and the source region, in which double diffusion is caused, an overall structure is referred to as a "Double Diffused MOS", or abbreviated as a "DMOS". On the surface of the $N^-$-type layer on which the P-type base region and the source region are formed, a gate oxide film is formed. Moreover, a gate electrode of polysilicon is formed on an upper portion of the gate oxide film, and thus a portion of the P-type base region which is located under the gate electrode will serve as a channel region. Furthermore, an emitter electrode is formed so as to extend over a portion of a surface of the source region of $N^+$-type and a central portion of a surface of the P-type base region, and a collector electrode is formed on a back surface of an $N^+$-type substrate.

As an alternative to the above-mentioned IGBT, a trench IGBT in which a gate electrode of a MOS is formed within a trench provided inside of silicon has been developed in the conventional art.

It is noted that an inverter circuit functions to change a dc voltage into an ac voltage. A typical inverter circuit includes the above-mentioned IGBT serving as a switching device and a freewheeling diode (FWD). The inverter circuit controls a two-phase or three-phase ac motor by employing a combination of four or six circuit elements each formed of the IGBT and the freewheeling diode connected in parallel with the IGBT. More specifically, the inverter circuit includes a dc terminal connected to a dc power supply, and causes each of the IGBTs to perform a switching operation, to thereby change a dc voltage to an ac voltage with a predetermined frequency, thereby supplying the ac voltage to a motor serving as a load.

The following prior art documents may be referred to: Japanese Patent Application Laid-Open No. 6-196705 (FIG. 1) (which will hereinafter be referred to as "JP 6-196705"); Japanese Patent Application Laid-Open No. 7-153942 (FIG. 1) (which will hereinafter be referred to as "JP 7-153942"); Japanese Patent Application Laid-Open No. 6-53511 (FIG. 1) (which will hereinafter be referred to as "JP 6-53511"); Japanese Patent Application Laid-Open No. 2-126682 (which will hereinafter be referred to as "JP 2-126682"); and Japanese Patent Application Laid-Open No. 8-116056.

The freewheeling diode is required in the conventional inverter circuit as described above because the motor serving as a load is inductive. Regarding this issue, details will be provided as follows.

The inductive load has a property of storing energy in a magnetic field generated by a current. Accordingly, change in a current means change in stored energy. In the present specification, a storage ability of an inductive load will be represented by "L". Upon interruption of a current flowing through the load, energy stored in L of the load is released by a matter which is attempting to interrupt the current, so that the energy will function to prevent change in the current. Instant release of the energy stored in the L of the motor leads to generation of an electric power which is high enough to degrade characteristics of the IGBT. Thus, when the IGBT performs a switching operation to suddenly interrupt the current flowing through the motor, the characteristics of the IGBT is significantly degraded because of the released energy.

In view of this, the freewheeling diode is provided, to cause the current flowing through the motor during an off state of the IGBT to freewheel through a bypass path, in order to prevent the current flowing through the motor from being changed under influence of the switching operation. For this reason, in the typical inverter circuit in the conventional art, the dc power supply and the motor are connected to each other. Thus, when the IGBT is turned off to stop applying a voltage to the motor, the current flowing through the motor flows through the freewheeling diode to thereby reverse the course as a direct current because of the energy stored in the L of the motor. As a result, the motor is placed in a state equivalent to a state where a reverse dc voltage is applied to the motor. Changing a ratio between a turn-on time period and a turn-off time period of the IGBT leads to change in a ratio between a time period during which a dc voltage is applied and a time period during which a reverse current is flowing. Accordingly, a voltage applied to the motor can be controlled to be uniform.

As such, by changing the ratio so as to become sinusoidal, it is possible to allow the IGBT to perform a switching operation to thereby supply an ac voltage from the dc power supply while preventing the current flowing through the motor from being suddenly interrupted because of the switching operation of the IGBT.

Because of the foregoing operating manner of the inverter circuit, there is a need of providing the freewheeling diode inverse-series connected to a given IGBT, or providing the freewheeling diode anti-parallel connected to another IGBT which is paired with the given IGBT, as described above.

In this regard, a conventional power MOSFET which is also used as a switching device does not require additionally connecting a freewheeling diode when the power MOSFET is used as a switching device of an inverter circuit, because the power MOSFET includes a built-in anti-parallel connected diode. However, a density of a conductible current of the power MOSFET is relatively low, and thus the power MOSFET is unsuitable for high current applications.

Hence, there is no choice but to employ an IGBT as a switching device of an inverter circuit for driving a motor or the like. However, the IGBT has a structure formed by changing a portion out of an N$^+$-type layer which is located on a side of a drain electrode, to a P$^+$-type layer in a substrate of a power MOSFET, and thus a diode is formed between a P$^+$-type collector layer in a back surface and an N$^+$-type buffer layer thereon. A breakdown voltage (a forward drop voltage Vf) of the diode is in a range approximately from 20V to 50V. Such voltage is too high as a breakdown voltage of a freewheeling diode. Because of presence of a barrier having such a high breakdown voltage, characteristics of the IGBT may be significantly degraded upon generation of heat due to a voltage applied during freewheeling. For this reason, while an IGBT is advantageous to a power MOSFET in view of a density of conductible current, the structure of the IGBT could not allow inclusion of a built-in diode, unlike a MOSFET, and therefore there is still a need of additionally connecting a freewheeling diode manufactured independently of the IGBT in the conventional inverter circuit employing the IGBT as a switching device.

As a consequence of the foregoing, to incorporate a diode into an IGBT in the same manner as a diode is incorporated in a power MOSFET which was developed earlier than the IGBT has been a concern in technologies. To this end, various approaches have ever been proposed.

For example, in a structure proposed in JP 7-153942, incorporation of a diode into an IGBT is achieved by forming an N$^+$-type layer which extends through a P$^+$-type collector layer in a back surface of the IGBT. Also, in a structure proposed in JP 6-53511, incorporation of a diode into an IGBT is achieved by locally providing a portion of a P$^+$-type collector layer in a back surface of the IGBT such that a portion of the P$^+$-type layer extends into an N$^+$-type layer. However, it should be noted that both JP 7-153942 and JP 6-53511 mention the above structures as wishful thinking, and the above structures have not yet be put into practical use, for the following reasons. Most of IGBTs commercially available have a reverse breakdown voltage of 600V or 1200V and an N$^-$-type layer must have a thickness in a range from 50 μm to 150 μm in order to maintain the breakdown voltage. On the other hand, a wafer must have a thickness in a range from 250 μm to 600 μm in order to undergo a wafer process (W/P). Hence, the P$^+$-type collector layer in the back surface will have a thickness of 100 μm or larger. Accordingly, it is difficult in practice to form an N-type polycrystalline region configured so as to extend through the P$^+$-type collector layer in the structure of JP 7-153942. Turning to the structure of JP 6-53511, the thickness of the N$^-$-type layer is too thick to implement a structure allowing flow of a current during W/P, which results in failure to benefit particular effects from the characteristics of the IGBT.

Alternatively, JP 2-126682 proposes connecting a portion of an N$^-$-type layer to a collector electrode in order to improve the characteristics of an IGBT. However, in JP 2-126682, since a diode does not have satisfactory characteristics and thus is unsuitable for use, a structure which makes the diode inoperable is disclosed.

Further, JP 6-196705 discloses a similar structure. Specifically, JP 6-196705 discloses a structure in which a P$^-$-type layer is formed in a P-type layer located on a side of a top surface, in order to improve recovery characteristics of a built-in diode. JP 6-196705 further teaches that an N$^-$-type layer has a thickness of 50 μm and a P$^+$-type collector layer has a thickness of 20 μm. Moreover, according to a manufacturing method described in JP6-196705, an N$^-$-type substrate is prepared first, the P$^+$-type collector layer and an N$^+$-type cathode layer in the back surface are formed, and then a MOSFET in the top surface is formed. The method of JP6-196705 requires carrying out all steps in W/P with a thickness of a wafer being maintained at approximately 80 μm. Thus, the method is disadvantageous in that it is extremely difficult to handle the wafer during the W/P.

SUMMARY OF THE INVENTION

It is an object of the present invention to provide a structure with improved IGBT with a built-in FWD in which each of the IGBT and the FWD can exhibit its electrical characteristics satisfactorily suitable for practical use, and a method of manufacture of the structure.

An insulated gate bipolar transistor according to the present invention includes a semiconductor substrate of a first conductivity type, an insulated gate transistor, a first main electrode, a first semiconductor layer of the first conductivity type, a second semiconductor layer of a second conductivity type and a second main electrode. The semiconductor substrate includes a first main surface and a second main surface. The insulated gate transistor is formed in a region of the semiconductor substrate on a side of the semiconductor substrate where the first main surface is included, and includes a channel of the first conductivity type which is formed within a base region of the second conductivity type extending from the first main surface toward an interior of the semiconductor substrate, during an on state of the insulated gate transistor. The first main electrode is formed on the first main surface and is in contact with the base region of the insulated gate transistor at the first main surface. The first semiconductor layer of the first conductivity type is formed on the second main surface of the semiconductor substrate and facing the insulated gate transistor. The second semiconductor layer of the second conductivity type is formed on the second main surface of the semiconductor substrate and faces the insulated gate transistor. The second main electrode is formed on the first semiconductor layer and the second semiconductor layer. An interface between the second main electrode and each of the first semiconductor layer and the second semiconductor layer is parallel to the first main surface. Further, a distance between the first main surface and the interface is equal to 200 μm or smaller. Moreover, a thickness of each of the first semiconductor layer and the second semiconductor layer is equal to 2 μm or smaller.

The present invention produces an advantage of maintaining both electrical characteristics (VCE(sat)) exhibited when the insulated gate bipolar transistor with the built-in freewheeling diode serves as an IGBT and electrical characteristics (Vf) exhibited when the insulated gate bipolar transistor with the built-in freewheeling diode serves as a diode, at a relatively low level suitable for practical use.

More specifically, the second semiconductor layer occupies 30-80% of the second main surface in footprint, so that VCE(sat) of the IGBT can be maintained at a relatively low level. Alternatively, the first semiconductor layer occupies 20-70% of the second main surface in footprint, so that Vf of the diode can be maintained at a relatively low level. Also, a total width of the first semiconductor layer and the second semiconductor layer is controlled to be equal to 50 μm or larger. This makes it possible to maintain both the electric characteristics (VCE(sat)) of the IGBT and the electrical characteristics (Vf) of the diode at a relatively low level suitable for practical use.

BRIEF DESCRIPTION OF THE DRAWINGS

FIG. 1 is a circuit diagram of a power converter employing an IGBT with a built in FWD according to the present invention.

FIG. 2 is a longitudinal sectional view of a portion of an IGBT with a built-in FWD according to a first preferred embodiment of the present invention.

FIG. 3 is a longitudinal sectional view of a structure for simulation carried out for verifying the IGBT with the built-in FWD according to the first preferred embodiment of the present invention.

FIGS. 4A, 4B and 5 through 9 show results of simulation of the IGBT with the built-in FWD according to the first preferred embodiment of the present invention.

FIG. 14 is a longitudinal sectional view of an IGBT with a built-in FWD according to a modification of the second preferred embodiment of the present invention.

FIGS. 15 through 19 are longitudinal sectional views for illustrating a method of manufacturing an IGBT with a built-in FWD according to a third preferred embodiment of the present invention.

FIGS. 20 and 21 are longitudinal sectional views for illustrating a method of manufacturing an IGBT with a built-in FWD according to a modification of the third preferred embodiment of the present invention.

FIGS. 22 through 27 are longitudinal sectional views for illustrating a method of manufacturing an IGBT with a built-in FWD according to a fourth preferred embodiment of the present invention.

FIGS. 28 through 52 are plan views for showing specific examples of planar or two-dimensional positional relationship of first and second semiconductor layers according to each of the first through fourth preferred embodiments of the present invention.

DESCRIPTION OF THE PREFERRED EMBODIMENTS

Figure 4A:
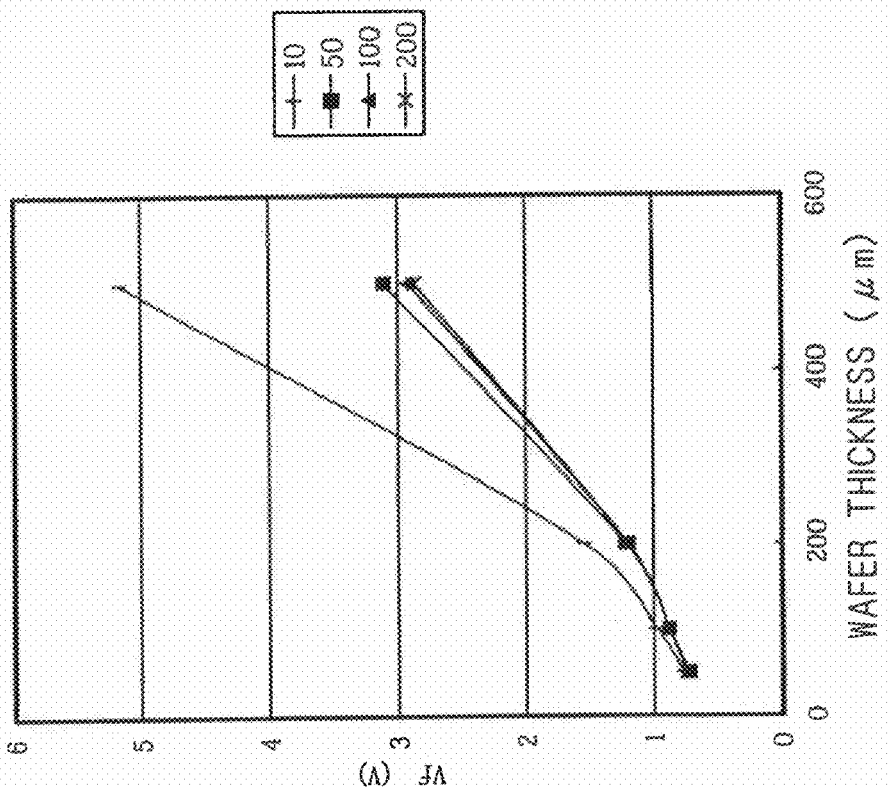

FIG. 1 illustrates a structure of an inverter circuit which is formed by replacing a circuit element composed of two chips on which a switching device and an anti-parallel connected freewheeling diode are mounted, respectively, in the conventional inverter circuit, with an IGBT with a built-in freewheeling diode according to the present invention. More specifically, in the inverter circuit in FIG. 1, an overall region including the IGBT serving as a switching device and the freewheeling diode (FWD) is mounted on a single chip, in other words, is formed by only the IGBT with a novel configuration.

Substantial operations of the circuit in FIG. 1 are identical to those of the conventional circuit. Specifically, the circuit in FIG. 1 controls appropriate combination of IGBTs forming a three-phase circuit so that they are turned on, to connect a dc power supply and a motor M as a load to each other. Then, a dc voltage is applied to the motor M, and a current gradually increases. Thereafter, the circuit controls each IGBT placed in an on state so that each IGBT is turned off. Upon this, while the current attempts to continue flowing because of an energy stored in L of the motor M, an IGBT(s) connected in series with the respective IGBTs which have been turned on earlier flows a current in a reverse direction, and therefore the motor M is inversely connected to the dc power supply. Thus, the current of the motor continues flowing without being suddenly interrupted, and the energy stored in the L is gradually returned to the dc power supply. Finally, the current gradually decreases.

In this manner, control of the inverter circuit is accomplished by an IGBT on a single chip, which provides for reduction in size of a semiconductor device controlling the inverter circuit.

In the following description, features in the structure of the IGBT with a built-in freewheeling diode and a novel method of manufacturing the same, which constitute essential parts of the present invention, will be described with reference to the accompanying drawings.

First Preferred Embodiment

FIG. 2 is a longitudinal sectional view of a portion of an exemplary structure of an IGBT with a built-in freewheeling diode (semiconductor device) according to a first preferred embodiment. In FIG. 2, a direction "X" is a width direction along a width of a silicon wafer, and a direction "Y" is a thickness direction along a thickness of the silicon wafer. The semiconductor device illustrated in FIG. 2 is achieved by applying the following features of the first preferred embodiment to an IGBT with a built-in freewheeling diode including a MOSFET cell having a DMOS structure.

First, the silicon wafer of the semiconductor device in FIG. 2 includes: 1) as a core portion of the silicon wafer, an $N^-$-type semiconductor substrate (which will be also referred to as an "$N^-$-type layer") 1 containing an impurity of a first conductivity type (N type in the present example), which includes a first main surface 1S1 and a second main surface 1S2; and 2) a cell of an insulated gate transistor (an N-type channel MOSFET in the present example) formed in a region of the semiconductor substrate 1 on one of plural sides of the semiconductor substrate 1 where the first main surface 1S1 is included (which side will be hereinafter referred to as a "first main surface side"), in particular, formed on the first main surface 1S1 and in a portion of the semiconductor substrate 1 having a predetermined depth from the first main surface 1S1. During an on state of the insulated gate transistor, a channel of the first conductivity type (an N-type channel) is formed within a base region 2 of a second conductivity type (P type in the present example) which extends toward an interior of the semiconductor substrate 1, i.e., from the first main surface 1S1 to the predetermined depth. More specifically, the cell of the insulated gate transistor in the semiconductor device in FIG. 2 includes: 1) the P-type base region 2 which is selectively formed under the first main surface 1S1 of the $N^-$-type semiconductor substrate 1 as a result of diffusion of P-type impurities; II) an $N^+$-type source region 3 (which will be also referred to as an "$N^+$-type layer 3") which is formed as a result of selective diffusion of a high concentration of N-type impurities which diffuse from a surface of the P-type base region 2 toward an interior of the P-type base region 2; III) a gate oxide film 4 formed on a region of the first main surface 1S1 of the N⁻-type substrate 1 composed of three parts of a part extending between respective edges of the P-type base region 2 and the source region 3, a part including a portion of a surface of the source region 3 close to the edge thereof, and a part extending outside the edge of the P-type base region 2; IV) a gate electrode 5 of polysilicon formed on a top surface of the gate oxide film 4; and V) an interlayer insulating film 6 covering exposed surfaces of the gate oxide film 4 and the gate electrode 5. A portion of the P-type base region 2 located immediately below the gate electrode 5 becomes a channel region. Additionally, the P-type base region 2 and the source region 3 are formed using the gate oxide film 4 as a mask.

The semiconductor device in FIG. 2 further includes: 3) a first main electrode (an emitter electrode in the present example) 7 which is formed on the first main surface 1S1 so as to cover a top surface of the interlayer insulating film 6 and is electrically connected to the P-type base region 2 of the insulated gate transistor at a portion of the first main surface 1S1 corresponding to a central portion of the surface of the P-type base region 2; 4) a first semiconductor layer (an N⁺-type cathode layer in the present example) 8 containing an impurity of the first conductivity type, which is formed so as to extend along the width direction X on a first region of the second main surface 1S2 of the semiconductor substrate 1 which faces the insulated gate transistor; and 5) a second semiconductor layer (a P⁺-type collector layer in the present example) 9 containing an impurity of the second conductivity type, which is formed so as to extend along the width direction X on a second region of the second main surface 1S2 of the semiconductor substrate 1 which is located adjacent to the first region and faces the insulated gate transistor.

Moreover, the semiconductor device in FIG. 2 also includes a second main electrode (a collector electrode in the present example) 10 formed on the first semiconductor layer 8 and the second semiconductor layer 9. An interface IF between the second main electrode 10 and the first and second semiconductor layers 8 and 9 is parallel to the first main surface 1S1. Thus, the collector electrode 10 over a back surface of the N⁻-type substrate 1 are electrically and mechanically connected to the P⁺-type collector layer 9 and the N⁺-type cathode layer 8 via a second interface IF2 and a first interface IF1, respectively, which form the interface IF.

Structural features of the semiconductor device in FIG. 2 are as follows.

First, C1) a distance between the first main surface 1S1 and the interface IF, in other words, a thickness D of the wafer is equal to 200 μm or smaller, and C2) each of respective thicknesses T8 and T9 of the first semiconductor layer 8 and the second semiconductor layer 9 is equal to 2 μm or smaller (0.5 μm, for example). Also, C3) the first interface IF1 between the first semiconductor layer 8 and the second main electrode 10 occupies 20-70% of the interface IF, or the second interface IF2 between the second semiconductor layer 9 and the second main electrode 10 occupies 30-80% of the interface IF.

Further, C4) a total width of a first width of the first semiconductor layer 8 and a second width of the second semiconductor layer 9 which extends along the width direction X parallel to the first main surface 1S1 and corresponding to a direction in which the first semiconductor layer 8 and the second semiconductor layer 9 are aligned is set to be in a range from 50 μm to 200 μm.

As described above, the P⁺-type collector layer 9 and the N⁺-type cathode layer 8 each having a thickness which is controlled to be equal to 2 μm or smaller during manufacture thereof are formed as separate semiconductor layers on the back (lower) surface of the N⁻-type substrate 1 having the thickness D controlled to be equal to 200 μm or smaller during manufacture thereof, while a total width of the respective widths of the layers 8 and 9 is controlled so as to be in the range from 50 μm to 200 μm.

Next, operations of the IGBT with the built-in freewheeling diode (built-in FWD) in FIG. 2 will be described. Given with the structure illustrated in FIG. 2, upon application of a predetermined collector voltage VCE between the emitter electrode 7 and the collector electrode 10 and a predetermined gate voltage VGE between the emitter electrode 7 and the gate electrode 5 (to turn on the gate), the channel region is inverted to be of an N type, so that a channel electrically linking the N⁻-type layer 1 and the N⁺-type layer 3 is formed within the P-type base region 2. Then, electrons are injected through the channel from the emitter electrode 7 into the N⁻-type layer 1. Because of the injection of the electrons, a forward bias is applied between the P⁺-type collector layer 9 and the N⁻-type layer 1 and holes are injected from the P⁺-type collector layer 9 into the N⁻-type layer 1. This results in considerable reduction of a resistance of the N⁻-type layer 1, to increase a current capacity of the IGBT. In the semiconductor device in FIG. 2, the N⁺-type cathode layer 8, as well as the P⁺-type collector layer 9, is formed on the collector electrode 10 while it is being sandwiched by two portions of the P⁺-type collector layer 9. Such configuration may have more difficulties in causing injection of holes from the P⁺-type collector layer 9 than a structure of an IGBT not including a built-in FWD in which only the P⁺-type collector layer 9 is formed on the whole surface of the collector electrode. Nonetheless, by adjusting a size of the P⁺-type collector layer 9 to an appropriate value, it is possible to allow the IGBT to satisfactorily operate for practical use, about which will be detailed later.

Next, transition from an on state to an off state of the IGBT in the semiconductor device will be described. In the structure in FIG. 2, the gate voltage VGE applied between the emitter electrode 7 and the gate electrode 5 during an on state is reduced to 0V, or a reverse bias is applied between the emitter electrode 7 and the gate electrode 5 (the gate is turned off). Then, the channel region is returned from an inverted state, i.e., an N-type state, to a P-type state. Further, because of termination of the injection of electrons from the emitter electrode 7, also the injection of holes from the P⁺-type collector layer 9 is terminated. Thereafter, the electrons and the holes accumulated in the N⁻-type layer 1 go out of the N⁻-type layer 1 toward the collector electrode 10 and the emitter electrode 7, respectively. Otherwise, the electrons and the holes are re-combined to each other within the N⁻-type layer 1, to disappear. The collector voltage VCE which can be applied between the emitter electrode 7 and the collector electrode 10 during an off state depends on the impurity concentration and the thickness of the N⁻-type layer 1.

In the semiconductor device in FIG. 2, the N⁺-type cathode layer 8 is provided so as to be sandwiched between two portions of the P⁺-type collector layer 9 in the lower surface 1S2 of the N⁻-type substrate 1. As a result of such configuration, upon application of a voltage VEC of a polarity reverse to that of the IGBT, a forward current flows through a PIN junction diode formed of the N⁺-type cathode layer 8, the P-type base region 2 on the first main surface side and the N⁻-type layer 1 interposed between the layer 8 and the region 2, because of the energy stored in the L of the load. This built-in diode formed of the N⁺-type cathode layer 8 and the like functions as a freewheeling diode which is anti-parallel connected to the IGBT in the conventional structure. Hence, degradation of characteristics of the IGBT due to the stored energy can be prevented without a need of connecting a freewheeling diode. Namely, the IGBT according to the present invention can function also as a freewheeling diode.

Further, when a different IGBT (an IGBT at a lower potential, for example, see FIG. 1) connected in series with the above-mentioned IGBT (an IGBT at a higher potential, for example, see FIG. 1) is turned on while a built-in diode is turned on, the injection of holes from the P-type base region 2 of the diode incorporated in the IGBT, as well as the injection of electrons from the N$^+$-type cathode layer 8, is terminated. Thereafter, the electrons and the holes accumulated as carriers in the N$^-$-type semiconductor substrate 1 go out of the N$^-$-type semiconductor substrate 1 toward the collector electrode 10 and the emitter electrode 7, respectively, or are re-combined to each other within the N$^-$-type semiconductor substrate 1, to disappear. At this time, a current flows in a direction reverse to a current flowing during an on state of the diode. This current is called a "recovery current". In general, a diode is desired to have a property of reducing such reverse current.

<Verification by Simulation>

The above-described operations of the semiconductor device are verified by simulation using a software program "MEDICI". A structure of a semiconductor device subjected to the simulation is shown in FIG. 3. Specifically, in the structure in FIG. 3, either a P-type layer with an impurity concentration of 1E19 and a thickness of 3 μm or an N-type layer with an impurity concentration of 1E19 and a thickness of 1 μm is provided on a top surface of an N$^-$-type layer. It is noted that the above-defined P-type layer is employed only for calculation of a forward drop voltage Vf of a built-in diode, and the above-defined N-type layer is employed only for calculation of a collector-emitter voltage VCE(sat) of an IGBT in saturation, in place of the above-defined P-type layer. Also, a P-type collector layer and an N-type cathode layer each with an impurity concentration of 1E19 and a thickness of 0.3 μm are formed adjacent to each other on a lower (back) surface of the N$^-$-type layer. Directions "X" and "Y" in FIG. 3 are identical to the width direction X and the thickness direction Y in FIG. 2, respectively. In the structure for the simulation, the thickness of each of the P-type collector layer and the N-type cathode layer is set to be 0.3 μm, taking into account a fact that both the P-type collector layer and the N-type cathode layer are manufactured in a last step of a wafer process (W/P) in practice. It is additionally noted that a thickness of each of a P-type collector layer and an N-type cathode layer in an example of a device resulted from reduction to practice by the present inventors is set to be approximately 0.5 μm. Thus, in actually carrying out the simulation, calculation of an on voltage of each of a built-in diode and an IGBT is accomplished by calculating a forward drop voltage Vf of the diode on the assumption that a top layer of the structure shown in FIG. 3 includes the above-defined P-type layer and a positive potential is applied to the above-defined P-type layer forming the top layer of the structure in FIG. 3 on one hand, and by calculating a collector-emitter voltage VCE (sat) of the IGBT in saturation on the assumption that a top layer of the structure shown in FIG. 3 includes the above-defined N-type layer and a positive potential is applied to the P-type collector layer forming the lowest layer of the structure in FIG. 3 on the other hand.

Figure 4B:
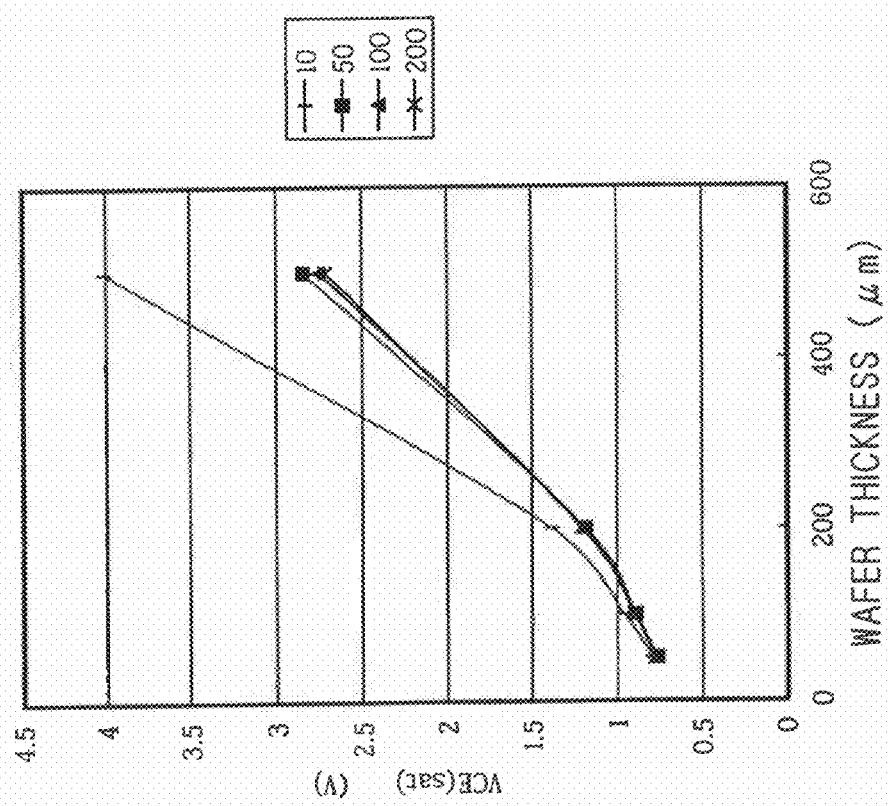
Figure 8:
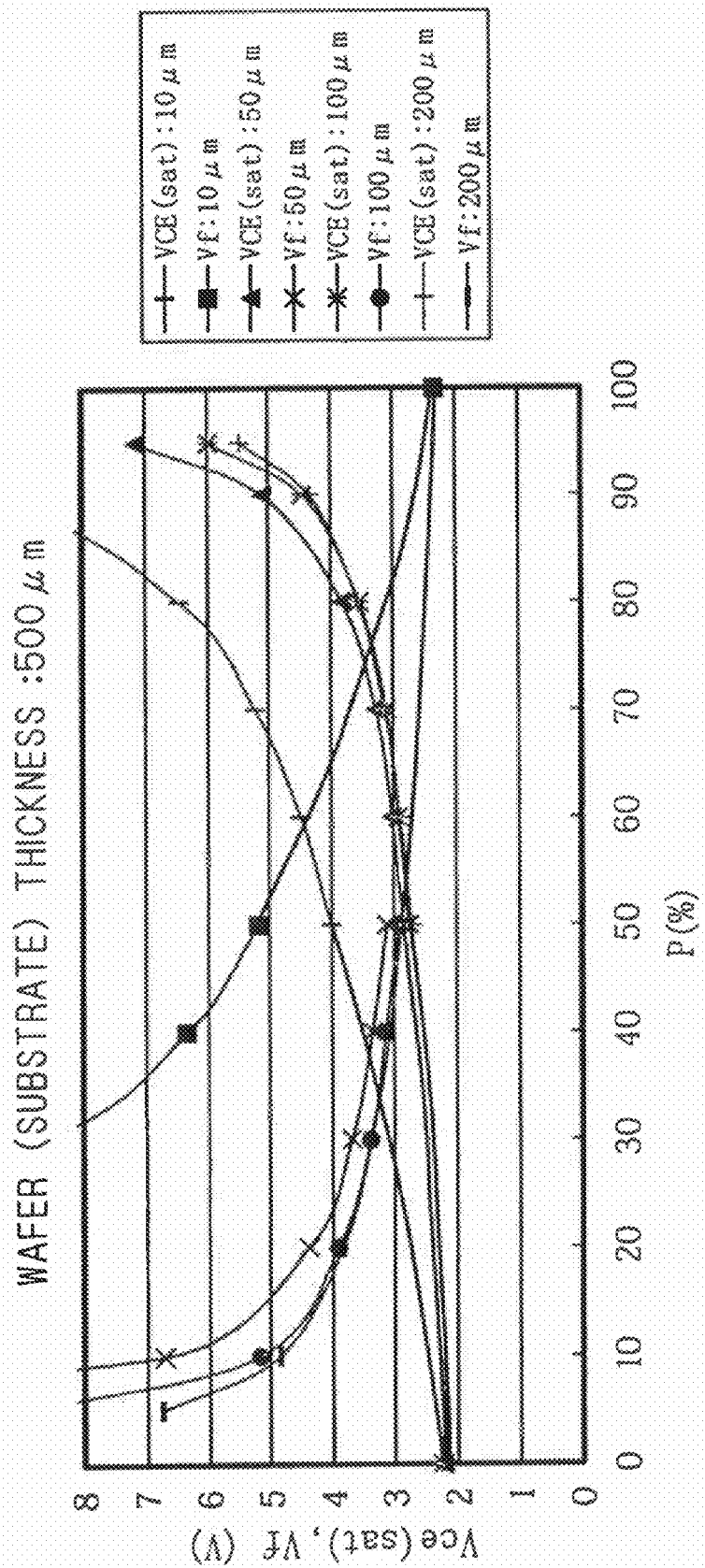

First, a collector-emitter voltage VCE(sat) with an IGBT in saturation and a forward drop voltage Vf of a diode in the IGBT which vary in accordance with variation of the wafer thickness D from 50 μm to 500 μm are computed, assuming that each of the P-type collector layer and the N-type cathode layer occupies a half of the back surface of the N$^-$-type layer in the width direction X (so that respective widths of the two layers are identical to each other) in the structure shown in FIG. 3. Dependences of the voltages VCE(sat) and Vf upon the wafer thickness D resulted from the computation are shown in FIGS. 4A and 4B. In each of FIGS. 4A and 4B, values "10 μm", "50 μm", "10 μm" and "200 μm" in a small box on a right hand side of the figure is a value of a cell size corresponding to a total width W (see FIG. 3) of the width of the P-type collector layer and the width of the N-type cathode layer adjacent to the P-type collector layer. Thus, FIGS. 4A and 4B show not only the dependences of the voltages VCE (sat) and Vf upon the wafer thickness, but also dependences of the voltages VCE(sat) and Vf upon the cell size. As appreciated from FIGS. 4A and 4B, each of the voltages VCE(sat) and Vf increases as the wafer thickness (substantially equal to the thickness of the N$^-$-type layer) increases, and starts to drastically increase when the wafer thickness exceeds 200 μm. It is noted that the N$^-$-type layer is required to have a thickness of approximately 50 μm when a holding voltage is 600V and to have a thickness of approximately 100 μm when a holding voltage is 1200V in general, and has a thickness in a range from 50 μm to 150 μm, in most cases. It is also noted that the thickness of the wafer is in a range from 250 μm to 600 μm and the thickness of the P$^+$-type collector layer is set to be relatively large, in the conventional IGBT. However, the results regarding electrical characteristics shown in FIGS. 4A and 4B clarify that the thickness of the wafer must be set to be equal to 200 μm, at the maximum, or smaller in order to form an IGBT with a built-in freewheeling diode on the wafer, because formation of a structure including an IGBT plus a diode on a wafer with a thickness exceeding 200 μm would cause serious problems to performances of the IGBT and the diode.

Next, optimization of the widths of the P-type collector layer and the N-type cathode layer on the back surface of the N$^-$-type layer is performed. To this end, the total width W of the P-type collector layer and the N-type cathode layer is set to take four sample values 10 μm, 50 μm, 100 μm and 200 μm, and four situations in which the wafer thickness D is set to be 50 μm, 100 μm, 200 μm and 500 μm, respectively, are provided. Then, in each of the four situations, the voltages VCE (sat) and Vf are computed while a width ratio between the P-type collector layer and the N-type cathode layer (, or a ratio of a width of each of the P-type collector layer and the N-type cathode layer to the cell size W) is varied. Results from the computation in the four situations are shown in FIGS. 5, 6, 7 and 8, respectively. It is noted that a horizontal axis of a graph in each of FIGS. 5, 6, 7 and 8 indicates the ratio P of the width of the P-type collector layer 9 to the cell size W in terms of percentage. Accordingly, subtraction of a value (%) of the ratio P on the horizontal axis from 100(%) in each of FIGS. 5, 6, 7 and 8 gives the ratio (100-P) of the width of the N-type cathode layer 8 to the cell size W in terms of percentage. As appreciated from FIGS. 5, 6, 7 and 8, each of the voltage VCE(sat) of the IGBT and the voltage Vf of the diode tends to increase as the ratio P of the P-type collector layer 9 decreases (in other words, the N-type cathode layer occupies more), or as the ratio of the N-type cathode layer 8 decreases (in other words, the P-type collector layer 9 occupies more). Attention should be drawn to the situation where the wafer thickness is 500 μm. In this situation, the voltages VCE(sat) and Vf are kept relatively high notwithstanding variation in the cell size W. Thus, it can be estimated that a device with a wafer thickness of 500 μm is unsuitable for practical use in view of its electrical characteristics. From FIGS. 5, 6, 7 and 8, it is shown that the width of the P-type collector layer 9 occupies 30-80% of the cell size W, preferably, and the width of the N-type cathode layer 8 occupies 20-70% of the cell size W, preferably, in order to provide a device which includes an IGBT and a diode both mounted on a single chip and has excellent electrical characteristics to be properly operable in practical use, in a situation where the wafer thickness D is set to be 200 μm or smaller.

Figure 9:
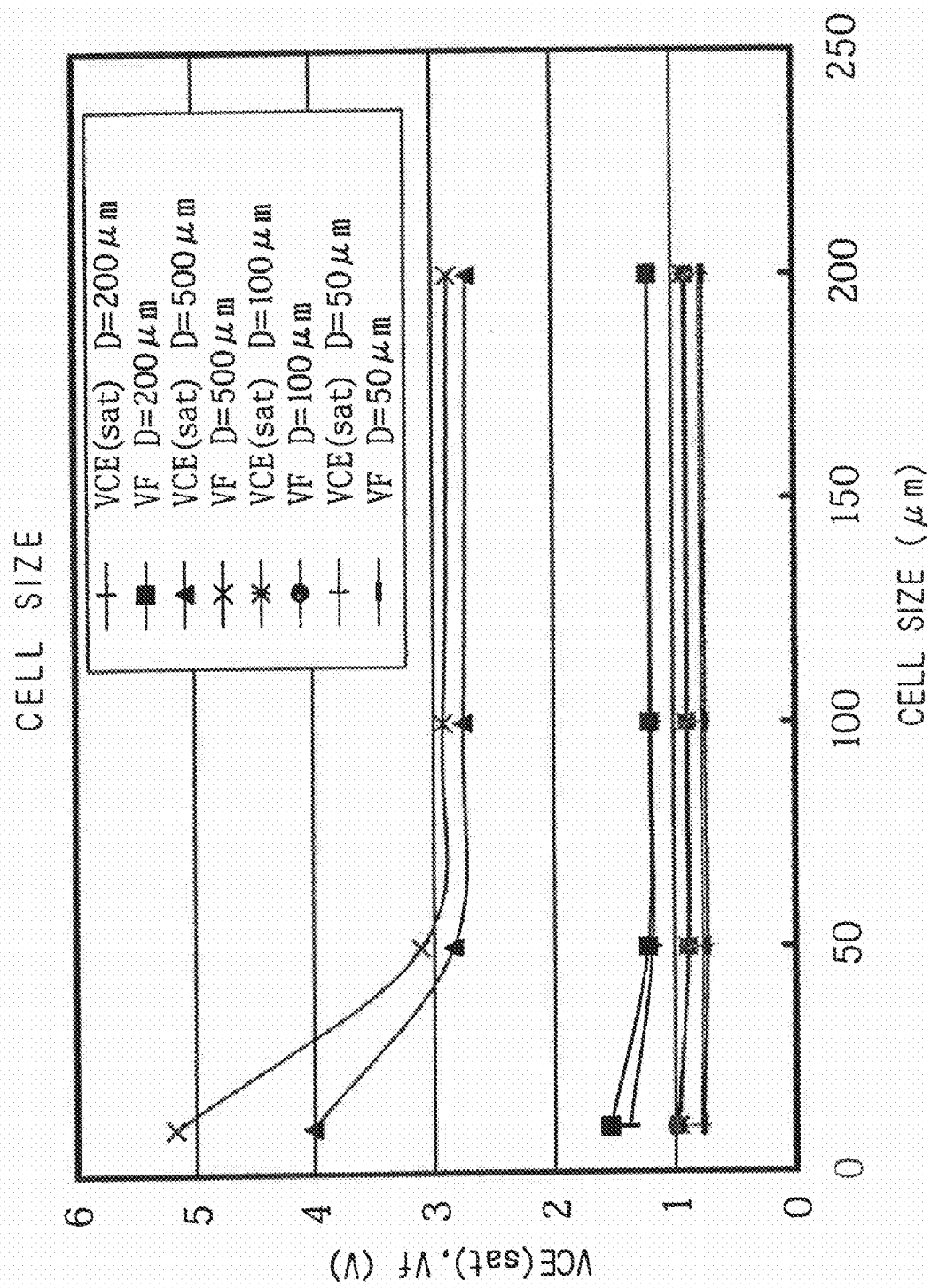

Relationship between the cell size W and the voltages VCE(sat) and Vf provided using the above results is shown in FIG. 9. In FIG. 9, each of values "50 μm", "100 μm", "200 μm" and "500 μm" in a box on a right hand side of the figure is the wafer thickness D. It is appreciated from FIG. 9 that as long as the cell size W (see FIG. 3) is equal to 50 μm or larger, each of the voltages VCE(sat) and Vf does not depend upon the cell size and is kept at the substantially same level, while still depends on the wafer thickness D (substantially equal to the thickness of the N$^-$-type layer). Hence, it can be concluded that the cell size W along the width direction X is preferably set to be 50 μm or larger in view of electrical characteristics of the IGBT and the FWD when the wafer thickness D is equal to 500 μm or smaller (D≦500 μm), or the wafer thickness D is equal to 200 μm or smaller (D≦200 μm).

<First Modification>

Figure 10:
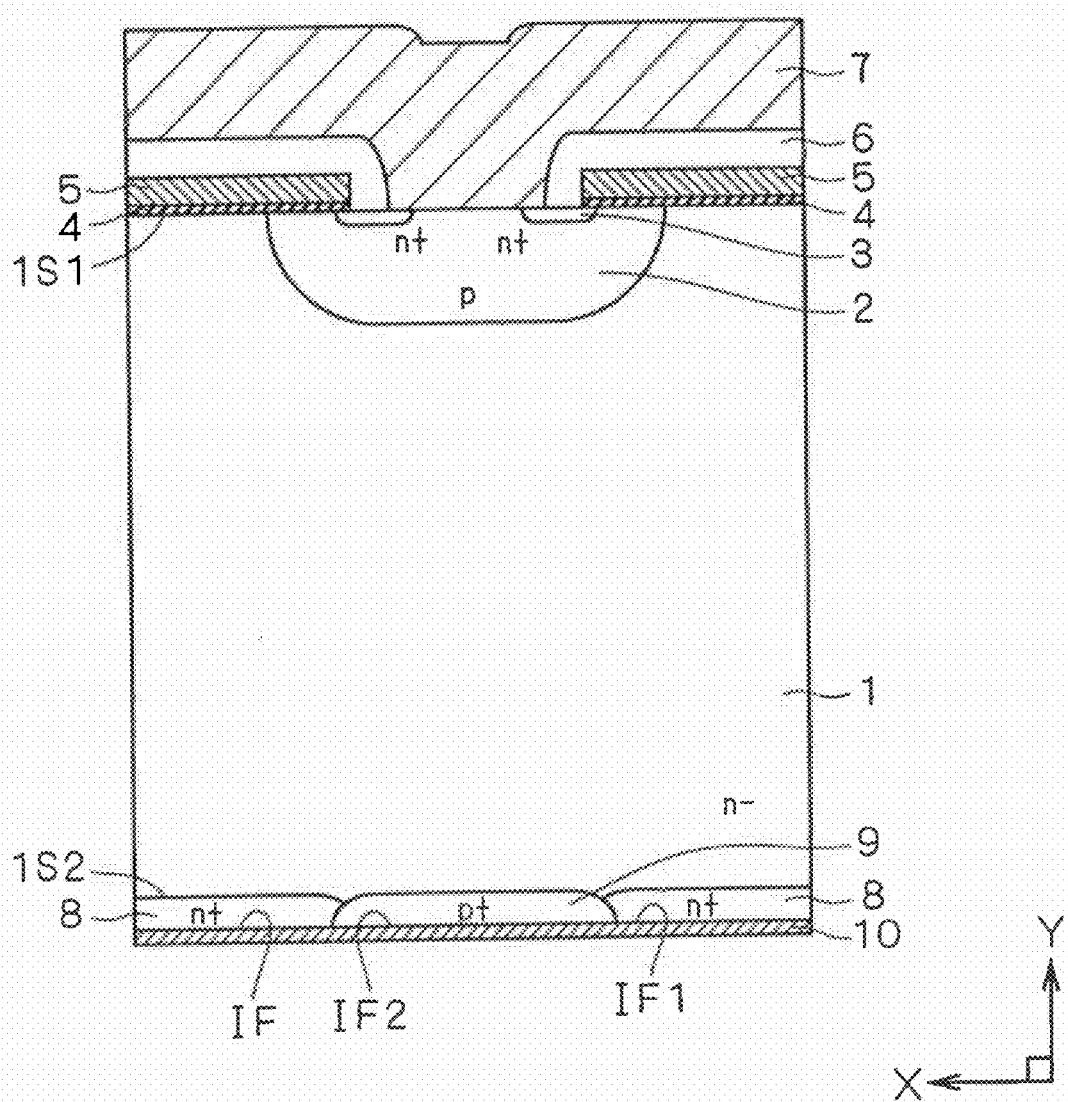
FIG. 10 is a longitudinal sectional view of an IGBT with a built-in FWD according to a first modification of the first preferred embodiment of the present invention.

In place of the structure illustrated in FIG. 2, modification as illustrated in FIG. 10 will achieve the same operations and effects. In a structure shown in FIG. 10, a semiconductor layer on the back surface of the substrate, which is vertically aligned with an interface between the base region 2 and the emitter electrode 7 is the second semiconductor layer 9. In other words, the structure in FIG. 10 is formed by positionally switching the first and second semiconductor layers 8 and 9 in the structure in FIG. 2.

<Second Modification>

Figure 11:
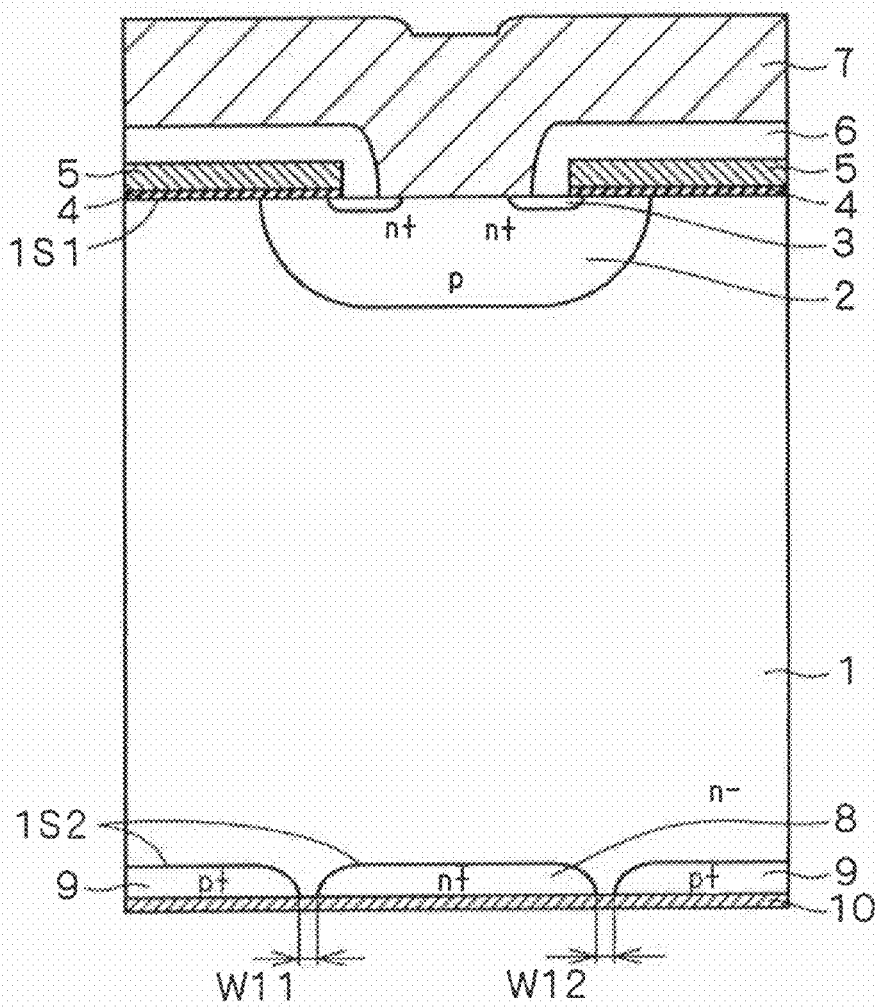
FIG. 11 is a longitudinal sectional view of an IGBT with a built-in FWD according to a second modification of the first preferred embodiment of the present invention.

In place of the structure illustrated in FIG. 2 or 10, modification as illustrated in FIG. 11 will achieve the substantially same operations and effects. In a structure shown in FIG. 11, a portion of the back surface of the N$^-$-type layer 1 is interposed between the first semiconductor layer 8 and the second semiconductor layer 9. Depending on a ratio of a dimension W11, W12 along the width direction X of the interposed portion of the N$^-$-type layer 1 to the cell size, I) when the width of the P-type collector layer 9 is set to occupy 30-80% of the cell size, the ratio P of the width of the N-type cathode layer 8 to the cell size is reduced as compared to that in the structure in FIG. 2 or 3 in which the width of the N-type cathode layer 8 occupies 20-70% of the cell size; and II) when the width of the N-type cathode layer 8 is set to occupy 20-70% of the cell size, the ratio P of the width of the P-type collector layer 9 to the cell size is reduced to that in the structure in FIG. 2 or 3 in which the width of the P-type collector layer 9 occupies 30-80% of the cell size. Also in the second modification, the range of the cell size is determined based on FIG. 9.

<Third Modification>

Figure 12:
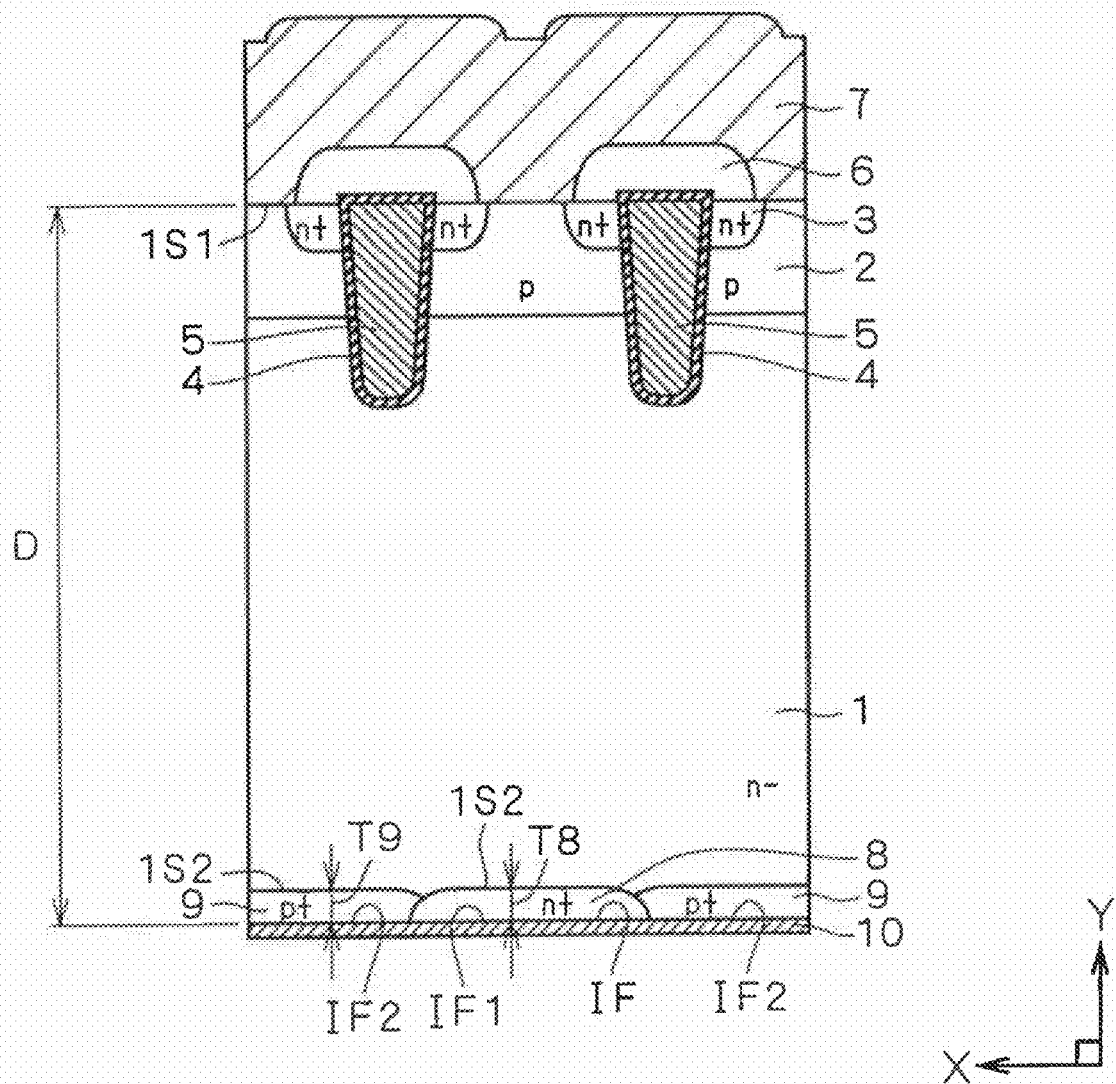
FIG. 12 is a longitudinal sectional view of an IGBT with a built-in FWD according to a third modification of the first preferred embodiment of the present invention.

Though the structures shown in FIGS. 2, 10 and 11 are provided by applying the features of the present invention to a MOSFET cell having a DMOS structure, the features of the present invention described above (respective ranges of the wafer thickness D and the thicknesses of the first and second semiconductor layers 8 and 9, the ratio of each of the first and second semiconductor layers 8 and 9 to the cell size, and the range of the cell size) can be applied to an IGBT with a built-in FWD including an insulated gate transistor (MOSFET) cell with a trench MOS structure. An example of a structure resulted from such application is illustrated in FIG. 12. Also the structure in FIG. 12 which is different only in a MOSFET cell structure from the structures according to the first preferred embodiment and the first and second modifications of the first preferred embodiment, operates in the same manner and produces the same effects as the structures according to the first preferred embodiment and the first and second modifications of the first preferred embodiment.

Additionally, an IGBT including a trench MOSFET cell is advantageous to an IGBT including a MOSFET with a DMOS structure in that a parasitic transistor has more difficulties in operating because of a gate formed within a trench. More specifically, formation of a gate within a trench would increase a density of many MOS structures formed on a surface, which results in reduction of a density of a current flowing through the MOSFET cell. Accordingly, the IGBT with the built-in FWD illustrated in FIG. 12 provides for more reduction of the voltage VCE(sat) of the IGBT, and thus more reduction of a recovery current of the diode, as compared to the structure illustrated in FIG. 2, because of the cell structure thereof.

Alternatively, the features of the present invention described above can be applied to an IGBT with a built-in freewheeling diode including a V-shaped MOSFET cell.

Second Preferred Embodiment

Figure 13:
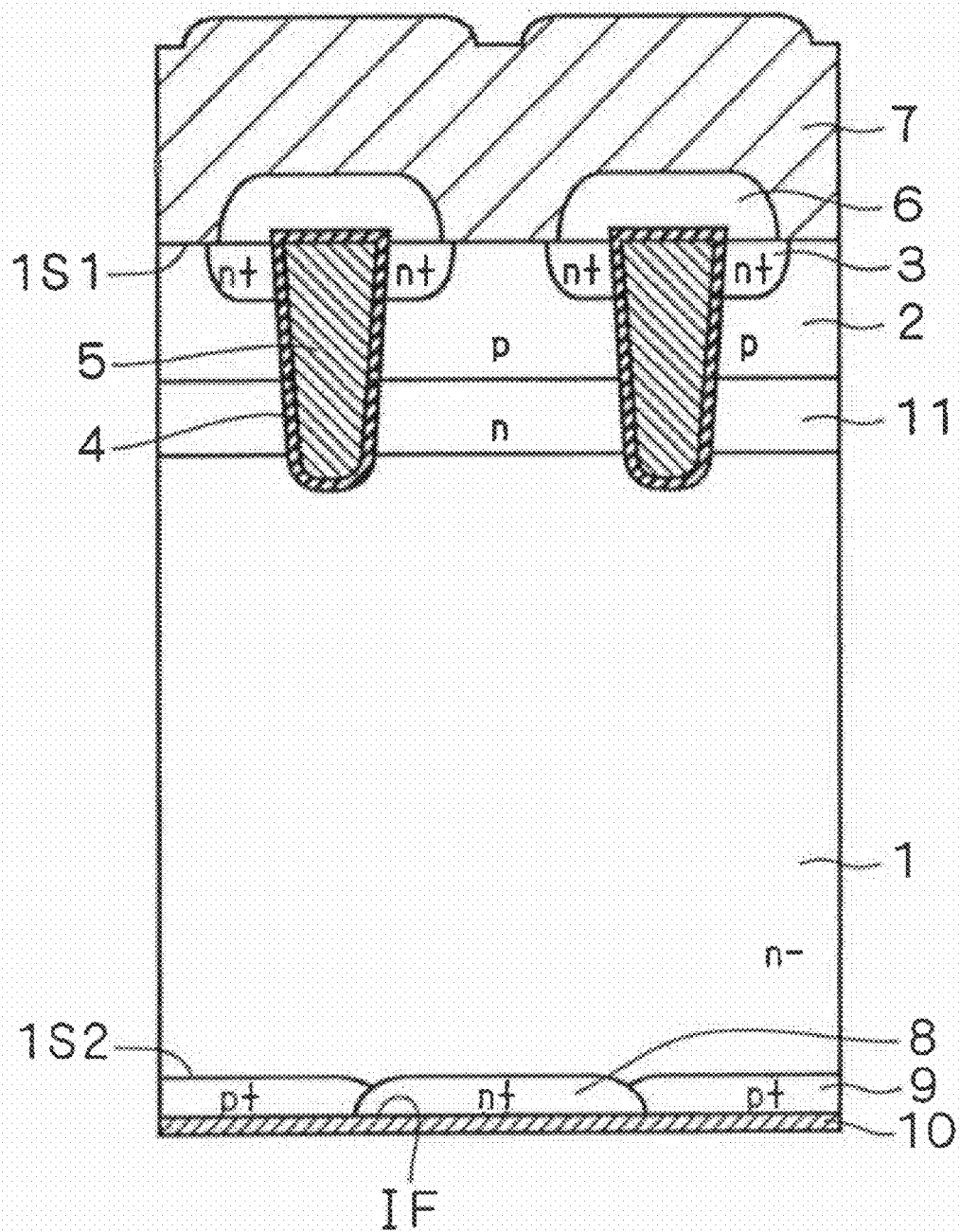
FIG. 13 is a longitudinal sectional view of a portion of an IGBT with a built-in FWD according to a second preferred embodiment of the present invention.

FIG. 13 is a longitudinal sectional view of an IGBT with a built-in FWD according to a second preferred embodiment. A device illustrated in FIG. 13 is formed by additionally providing an N-type layer 11 in the device illustrated in FIG. 12 which includes a trench MOSFET cell with a gate electrode buried in each trench formed inside the N$^-$-type layer 1. The N-type layer 11 is horizontally interposed between adjacent trenches and is vertically interposed between the P-type base region 2 and the N$^-$-type layer 1. The device illustrated in FIG. 13 is identical in structure to the device illustrated in FIG. 12 in the other respects.

Operations of the device illustrated in FIG. 13, when it serves as the IGBT, are basically identical to those illustrated in FIG. 12. However, in the device illustrated in FIG. 13, the N-type layer 11 having a higher impurity concentration than that of the N$^-$-type semiconductor substrate 1 is additionally provided immediately under the P-type base region 2. As a result of this structure, holes injected into the N$^-$-type layer 1 from the P$^+$-type collector layer 9 on the back surface can not move freely because of a potential barrier formed by the N-type layer 11 located in a region where the holes diffuse, so that the holes are accumulated in a region immediately under an interface between the P-type base region 2 and the N-type layer 11. Accordingly, the structure of FIG. 13 provides for more reduction of the voltage VCE(sat) of the IGBT as compared to a structure not including the N-type layer 11.

Also, as the N-type layer 11 is depleted in an off state, no substantial influence will be exerted by the N-type layer 11 during an off state.

On the other hand, when the device illustrated in FIG. 13 serves as the diode, the N-type layer 11 functions to suppress injection of holes from the P-type base region 2. It is generally known that a recovery current of a diode depends on a density of carriers present in the vicinity of an anode of the diode. For this reason, an amount of holes injected from the P-type base region 2 is reduced because of the provision of the N-type layer 11, to thereby reduce a density of carriers present in the vicinity of an anode. As a result, a peak value of a recovery current of the diode is further reduced in recovery operation occurring while the diode is transiting from an on state to an off state.

In summary, the provision of the N-type layer 11 in the device illustrated in FIG. 13: I) hinders movement of the holes injected from the N$^-$-type substrate 1 into the P-type base region 2, thereby greatly contributing to further reduction of an on voltage when the IGBT operates; and II) hinders movement of the holes injected from the P-type base region 2 into the $N^-$-type substrate 1, to further reduce a density of carriers in the vicinity of the anode, thereby greatly contributing to improvement of recovery characteristics when the diode operates.

As described above, the structure in which the gate is buried in each trench and the N-type layer 11 having a higher impurity concentration than that of the substrate 1 is provided between adjacent trenches produces special effects on both the operations of the IGBT and the operations of the diode. Thus, the art of additionally including the N-type layer 11 is particularly effective in a case where an IGBT and a diode are formed on a singe chip.

Moreover, the concept of interposing the N-type layer 11 between the P-type base region 2 and the $N^-$-type semiconductor substrate 1 can be applied to the structure illustrated in FIG. 2. An example of a structure resulted from such application is illustrated in FIG. 14 which is a longitudinal sectional view of the corresponding structure. However, if the N-type layer 11 is additionally provided so as to surround the whole bottom surface of the P-type base region 2 in the structure illustrated in FIG. 2, it may cause another disadvantage of reducing a breakdown voltage as compared to the structure not including the N-type layer 11.

In contrast thereto, the structure of trench type illustrated in FIG. 13 does not suffer reduction of a breakdown voltage in spite of the provision of the N-type layer 11. Also in this regard, the structure illustrated in FIG. 13 which is formed by applying the N-type layer 11 to the structure illustrated in FIG. 12 is technically significant.

Additionally, the structure according to the second preferred embodiment additionally including the N-type layer 11 can be expressed in a more general way, as follows. The semiconductor substrate 1 includes the semiconductor layer 11 of the first conductivity type which extends from an interface between the base region 2 and the semiconductor substrate 1 toward an interior of the semiconductor substrate 1 and has a higher impurity concentration than that of a portion of the semiconductor substrate 1 which is in contact with the semiconductor layer 11 to form an interface with the semiconductor layer 11.

Third Preferred Embodiment

A method of manufacturing an IGBT with a built-in FWD according to a third preferred embodiment essentially includes: 1) forming an MOSFET cell and a first main electrode used for the IGBT in a region on a first main surface side of a semiconductor substrate of a first conductivity type; 2) polishing the semiconductor substrate provided after formation of the MOSFET cell, from a second main surface thereof (a surface opposite and substantially parallel to the first main surface), to make a thickness of the semiconductor substrate equal to 200 μm or smaller; 3) forming a first semiconductor layer of the first conductivity type and a second semiconductor layer of a second conductivity type adjacent to the first semiconductor layer such that the first and second semiconductor layers extend from a region of the second main surface of the polished semiconductor substrate which faces the MOSFET cell toward an interior of the semiconductor substrate; and 4) forming a second main electrode used for the IGBT which is in contact with the first and second semiconductor layers on the second main surface of the semiconductor substrate provided after formation of the first and second semiconductor layers.

As described above, the manufacturing method according to the third preferred embodiment allows the first and second semiconductor layers to be formed in a region of the semiconductor substrate on one of plural sides of the semiconductor substrate where the second main surface is included (which side will hereinafter be referred to as a "second main surface side") in the latter half of the whole wafer process, in particular, after manufacture of the MOSFET cell involving a relatively large number of steps. This makes it easier to control respective thicknesses of the semiconductor substrate and the first and second semiconductor layers such that each of the thicknesses is within a predetermined range required to ensure excellent electrical characteristics of the IGBT with the built-in FWD, and facilitates processes on the silicon wafer itself. Especially, the semiconductor substrate having a desired thickness can be formed simply by polishing the semiconductor substrate from the second main surface thereof around which the first and second semiconductor layers have not yet been formed, after the MOSFET cell is formed in the region on the first main surface side, as in the above-described step "2)". This produces a further advantage of providing for control of the thickness of the semiconductor substrate without structurally damaging the first and second semiconductor layers. In view of the foregoing advantages, it can be estimated that the manufacturing method according to the third preferred embodiment as a whole facilitates manufacture of an IGBT with a built-in FWD as compared to a conventional manufacturing method, considering all steps in an entire wafer process.

Below, details of the manufacturing method according to the third preferred embodiment, essences of which have been described above, will be provided.

FIGS. 15, 16, 17, 18 and 19 are longitudinal sectional views of structures resulted from respective steps of the method of manufacturing the device including the IGBT with the built-in FWD illustrated in FIG. 2.

First, an N-type silicon substrate to be used as the $N^-$-type substrate 1 (corresponding to the semiconductor substrate of the first conductivity type) is prepared as illustrated in FIG. 15. At this stage, a thickness of a wafer is set to sufficiently endure various stresses exerted by the wafer process (W/P) after this stage. For example, a wafer having a thickness of approximately 500 μm is employed as the $N^-$-type substrate 1. An N-type silicon substrate having the foregoing thickness may be manufactured by a user himself, or alternatively be purchased from a wafer manufacturer.

Next, the MOSFET cell (including elements 2, 3, 4, 5 and 6) are formed in the region on the first main surface side of the $N^-$-type substrate 1 where the first main surface 1S1 is included as an upper surface of the $N^-$-type substrate 1, in a step illustrated in FIG. 16. In other words, the MOSFET cell is formed so as to extend on the first main surface 1S1 and from the first main surface 1S1 toward the interior of the $N^-$-type substrate. Also, the first main electrode 7 is formed on a portion of the first main surface 1S1 interposed between two portions of the $N^+$-type layer 3 and on the interlayer insulating film 6. It is noted that formation of the MOSFET cell and the first main electrode 7 illustrated in FIG. 16 is achieved using known techniques for manufacturing a MOSFET.

Subsequently, the $N^-$-type substrate 1 is polished from a lower surface or the second main surface 1S2A as illustrated in FIG. 16, to make the wafer thickness of the polished $N^-$-type substrate 1 equal to 200 μm or smaller, in a step illustrated in FIG. 17. After polishing, boron is implanted into a portion of the $N^-$-type substrate 1 from the second region where the P-type collector layer (the second semiconductor layer) is to be formed in the back surface or the second main surface 1S2 of the polished N⁻-type substrate 1.

Figure 18:
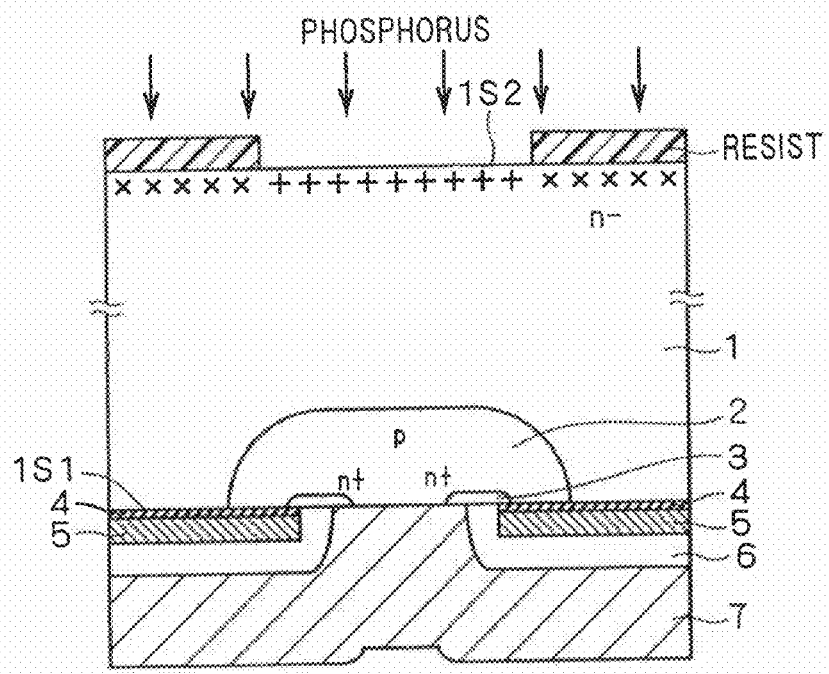

Then, phosphorus is implanted into a portion of the N⁻-type substrate 1 from the first region where the N-type cathode layer (the first semiconductor layer) is to be formed in the second main surface 1S2 of the polished N⁻-type substrate 1, in a step illustrated in FIG. 18.

Figure 19:
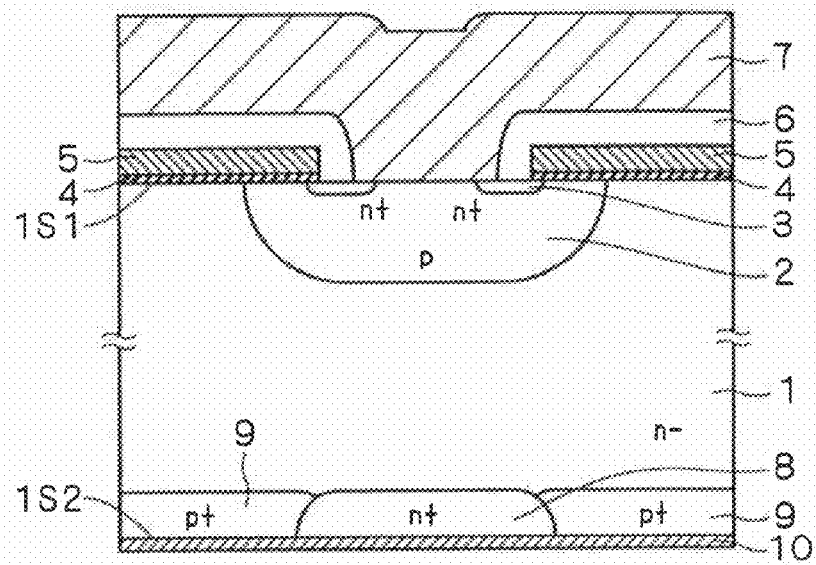

Thereafter, the second main electrode 10 is formed on the second main surface 1S2 after implantation of phosphorus, in a step illustrated in FIG. 19. In forming the second main electrode 10, a heat treatment is carried out, which activates the boron and the phosphorus implanted earlier. After that, an additional heat treatment (a temperature therefor is 450° C. or lower) for further activating the boron and the phosphorus may be carried out. As a result, the first and second semiconductor layers 8 and 9, the maximum thickness of which is approximately 2 μm, are formed in the region on the second main surface side within the N⁻-type substrate 1.

In the manufacturing method according to the third preferred embodiment, a step dealing with the wafer after it is polished to have a predetermined thickness which is relatively small (200 μm or smaller) is included only in a last stage of the whole manufacturing method. Thus, time and labor for processes performed with the wafer being thinned are reduced as compared to the conventional method described in JP 6-196705, which reduces a possibility of occurrence of defects such as a crack of the wafer during manufacture. The present inventors control all the steps described above with reference to FIGS. 17, 18 and 19 such that each of respective depths (or thicknesses) of the P⁺-type collector layer 9 and the N⁺-type cathode layer 8 is kept equal to approximately 0.5 μm, for example.

Figure 17:
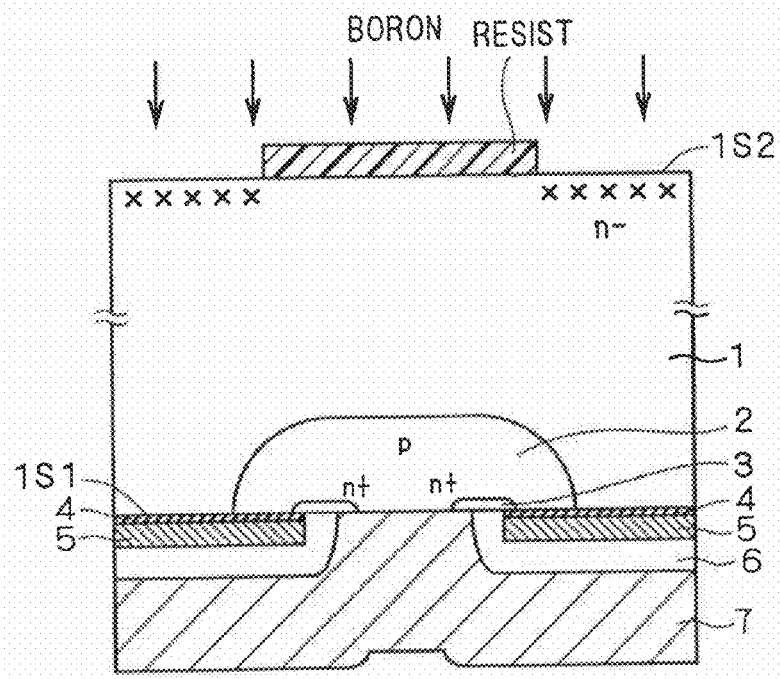

It should be noted that the steps illustrated in FIGS. 17 and 18 require alignment of the P-type collector layer 9 and the N-type cathode layer 8 during formation thereof. For the alignment, a photolithography apparatus capable of carrying out double-sided mask alignment can be employed. In particular, to employ such photolithography apparatus would eliminate a need of performing some process for alignment on a device being manufactured. Hence, a mark (a pattern on the first main surface) which is used for mask alignment for formation of the MOSFET cell in the region on the first main surface side where the first main surface 1S1 is included as a top surface, can be also used for alignment of the P-type collector layer 9 and the N-type cathode layer 8.

Figure 20:
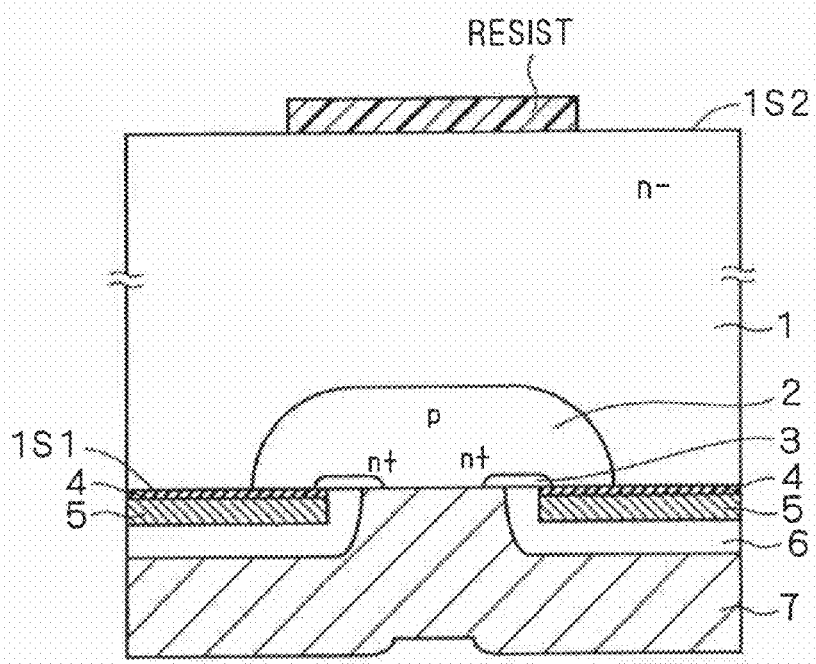

A modification of the manufacturing method according to the third preferred embodiment can be provided as illustrated in FIGS. 20 and 21, which includes alignment of the P-type collector layer 9 and the N-type cathode layer 8 in the manner alternative to the above-mentioned manner. Specifically, during formation of the P-type collector layer in a portion of the N⁻-type substrate 1 in the step illustrated in FIG. 17, a resist is formed for formation of a P-type layer as illustrated in FIG. 20. Next, prior to the implantation of the boron, etching is performed on a portion of the N⁻-type layer 1 which is near the resist and is included in the region on the second main surface side, as illustrated in FIG. 21. At this time, a mask alignment mark for carrying out a subsequent photolithography process is formed. In other words, a projection in the second main surface (etching pattern) formed as a result of the etching serves as the mask alignment mark used for alignment of the P-type collector layer 9 and the N-type cathode layer 8. Subsequently, the implantation of the boron is carried out. Then, the mark as formed is used for mask alignment required in formation of the N-type cathode layer in a portion of the N⁻-type substrate 1 in the step illustrated in FIG. 18. The method according to this modification makes it possible to achieve alignment required for formation of the P-type collector layer 9 and the N-type cathode layer 8 without employing a photolithography apparatus carrying out double-sided mask alignment.

Additionally, a sequence of formation of the P-type collector layer 9 and the N-type cathode layer 8 (sequence of the steps in FIGS. 17 and 18) may be changed in the third preferred embodiment.

Further, the manufacturing method according to the third preferred embodiment can be applied to manufacture of a trench IGBT with a built-in freewheeling diode as illustrated in FIG. 12 (simply by replacing the steps for manufacturing the MOSFET cell illustrated in FIG. 16 with known steps for manufacturing a trench MOSFET cell).

Fourth Preferred Embodiment

A method of manufacturing an IGBT with a built-in FWD according to a fourth preferred embodiment essentially includes: 1) forming a MOSFET cell in a region on a first main surface side of a semiconductor substrate of a first conductivity type; 2) polishing the semiconductor substrate after formation of the MOSFET cell, from a second main surface thereof, to make a thickness of the semiconductor substrate equal to 200 μm or smaller; 3) forming a first semiconductor layer of the first conductivity type and a second semiconductor layer of a second conductivity type adjacent to the first semiconductor layer such that the first and second semiconductor layers extend from a region of the second main surface of the polished semiconductor substrate which faces the MOSFET cell toward an interior of the semiconductor substrate; and 4) forming a first main electrode and a second main electrode used for the IGBT, respectively, on the first main surface and the second main surface of the semiconductor substrate having the first and second semiconductor layers formed therein.

Below, an example of the method of manufacturing an IGBT with a built-in FWD according to the fourth preferred embodiment, will be described with reference to the drawings.

FIGS. 22 through 27 are longitudinal sectional views of structures resulted from respective steps of the method of manufacturing the device including the IGBT with the built-in FWD illustrated in FIG. 2.

First, an N-type silicon substrate to be used as the N⁻-type substrate 1 is obtained, i.e., is manufactured by a user himself (be prepared) or is purchased, in a step illustrated in FIG. 22.

Next, the MOSFET cell is formed in the region on the first main surface side of the N⁻-type substrate 1 where the first main surface is included as a top surface of the N⁻-substrate 1, in a step illustrated in FIG. 23. The first main electrode is not formed at this time, unlike the third preferred embodiment.

Subsequently, in a step illustrated in FIG. 24, the N⁻-type substrate 1 is polished from the second main surface thereof (back surface thereof), to make the thickness thereof equal to 200 μm or smaller. Thereafter, boron is implanted into a portion of the N⁻-type substrate 1 where the P⁺-type collector layer is to be formed in a region on the second main surface side.

Figure 25:
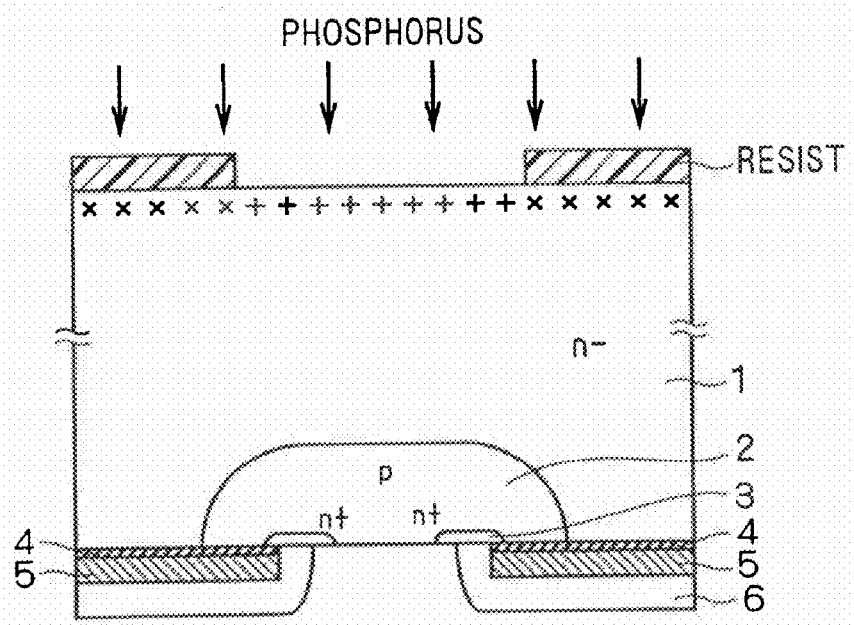

Then, phosphorus is implanted into a portion of the N⁻-type substrate 1 where the N⁺-type cathode layer is to be formed in the region on the second main surface (back surface) side, in a step illustrated in FIG. 25.

Figure 26:
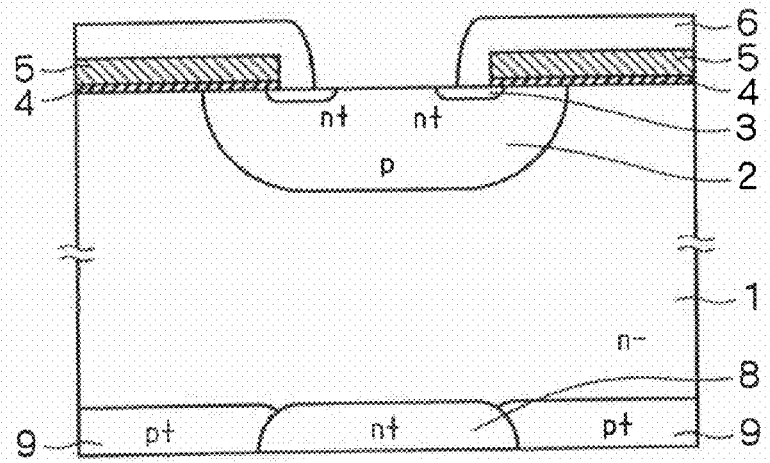

After that, a heat treatment is carried out at a temperature of 800° C. or higher, to activate the implanted boron and phosphorus, in a step illustrated in FIG. 26. This results in formation of the P⁺-type collector layer 9 and the N⁺-type cathode layer 8 adjacent to each other in a region on the second main surface (back surface) side of the N⁻-type substrate. At this time, each of thicknesses of the layers 8 and 9 is controlled to be equal to 2 μm or smaller.

Lastly, the first and second main electrodes 7 and 10 are formed on the top surface and the back surface, respectively, in a step illustrated in FIG. 27.

According to the fourth preferred embodiment, the heat treatment for activating the boron and the phosphorus can be carried out before both the first and second main electrodes are formed. This results in increased efficiency in activating impurities as compared to the third preferred embodiment. Accordingly, it is possible to reduce an amount of the boron and the phosphorus implanted into the N⁻-type substrate 1 by an ion implantation process, as compared to the third preferred embodiment. Further, a limit to the impurity concentration can be increased is higher in the fourth preferred embodiment than in the third preferred embodiment, which correspondingly improves flexibility in designing. In summary, in the manufacturing method according to the fourth preferred embodiment, since an implantation process for forming the first and second semiconductor layers and the heat treatment at a temperature of 800° C. or higher are sequentially carried out, before formation of the first and second main electrodes, a margin during manufacture of the first semiconductor layer 8 and the second semiconductor layer 9 is increased.

Additionally, a sequence of formation of the P⁺-type collector layer 9 and the N⁺-type cathode layer 8 may be changed also in the fourth preferred embodiment. Further, also the manufacturing method according to the fourth preferred embodiment can be applied to manufacture of a trench IGBT with a built-in freewheeling diode as illustrated in FIG. 12 or 13.

Remarks

Though the overall description in the preferred embodiments has been made with respect to an N-type channel IGBT with a built-in FWD for convenience purposes, the present invention can be applied to a P-type chancel IGBT, of course. In such a case, a P-type semiconductor substrate, an N-type base region of the IGBT, a collector electrode, a P⁺-type emitter layer and an N⁺-type emitter layer correspond to the above-described "semiconductor substrate of the first conductivity type", "base region of the second conductivity type", "first main electrode", "first semiconductor layer" and "second semiconductor layer", respectively.

<Positional Relationship Between First and Second Semiconductor Layers>

FIGS. 28 through 52 show specific examples of planar or two-dimensional positional relationship of the first semiconductor layer (N-type cathode layer) 8 and the second semiconductor layer (P-type collector layer) 9 both of which are provided on the second main surface side as described in the first, second, third and fourth preferred embodiments. Each of the FIGS. 28 through 52 is a plan view schematically depicting arrangement of the semiconductor layers 8 and 9 when the semiconductor layers 8 and 9 are seen through the second main electrode (collector electrode) 10 from the back surface of the semiconductor device according to the present invention. Below, positional relationship of the first and second semiconductor layers 8 and 9 shown in each of FIGS. 28 through 52 will be briefly described.

Figure 30:
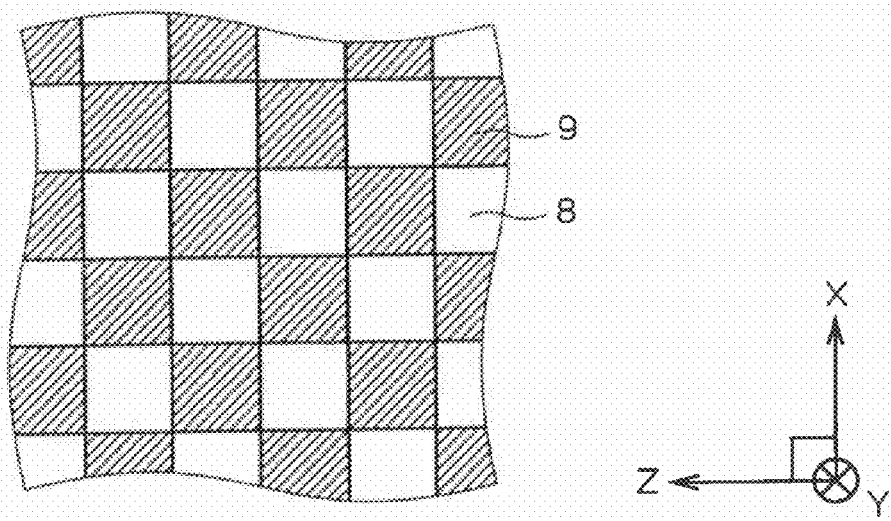
Figure 31:
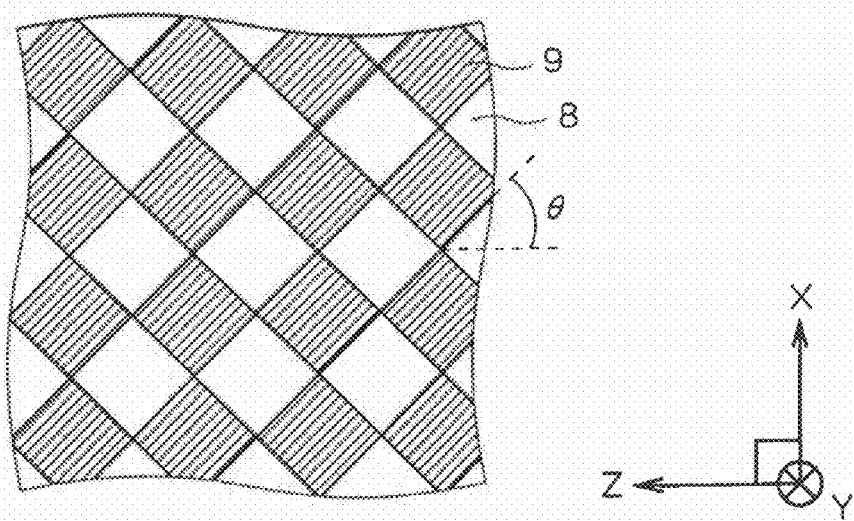
Figure 34:
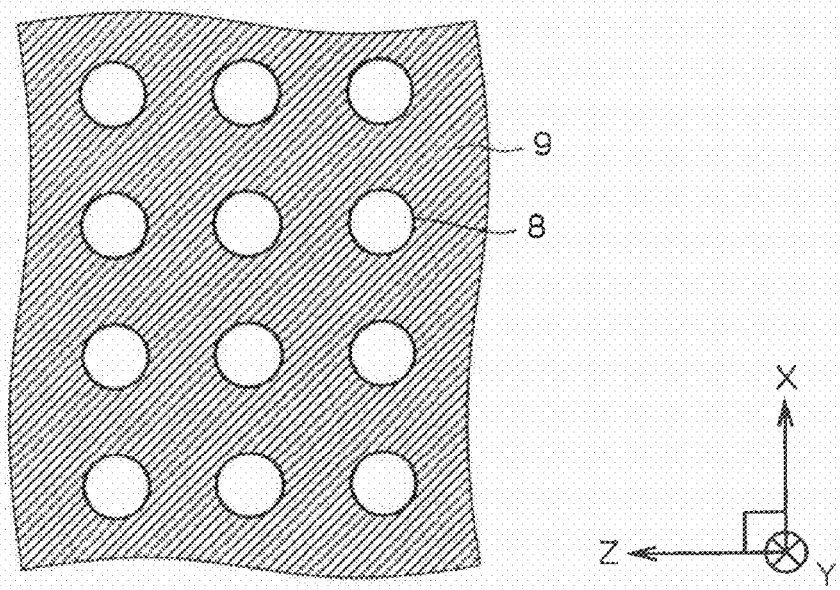
Figure 35:
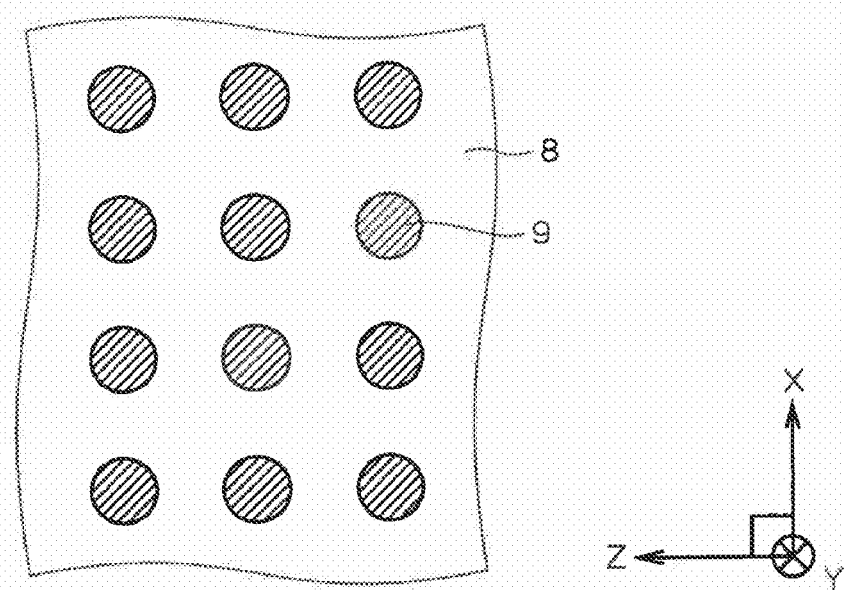
Figure 38:
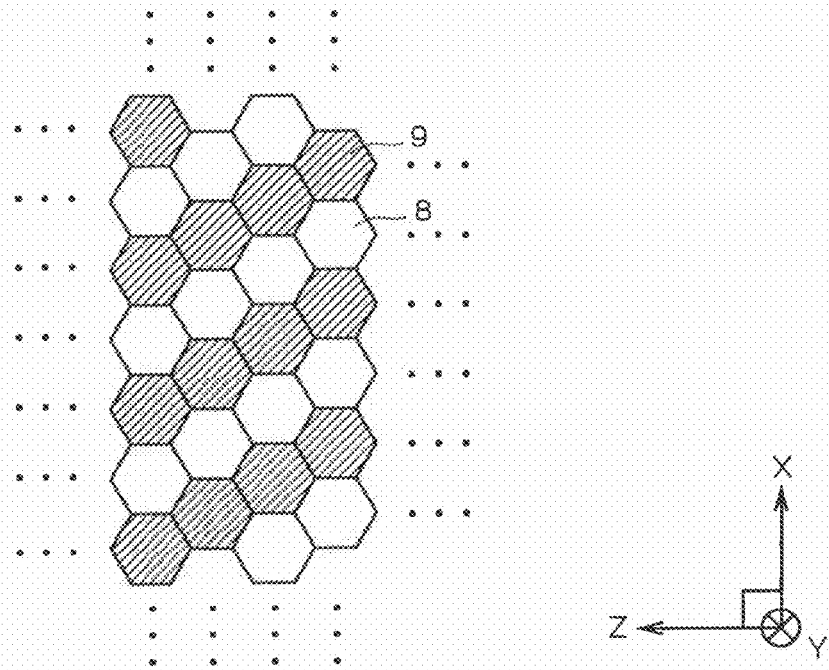
Figure 39:
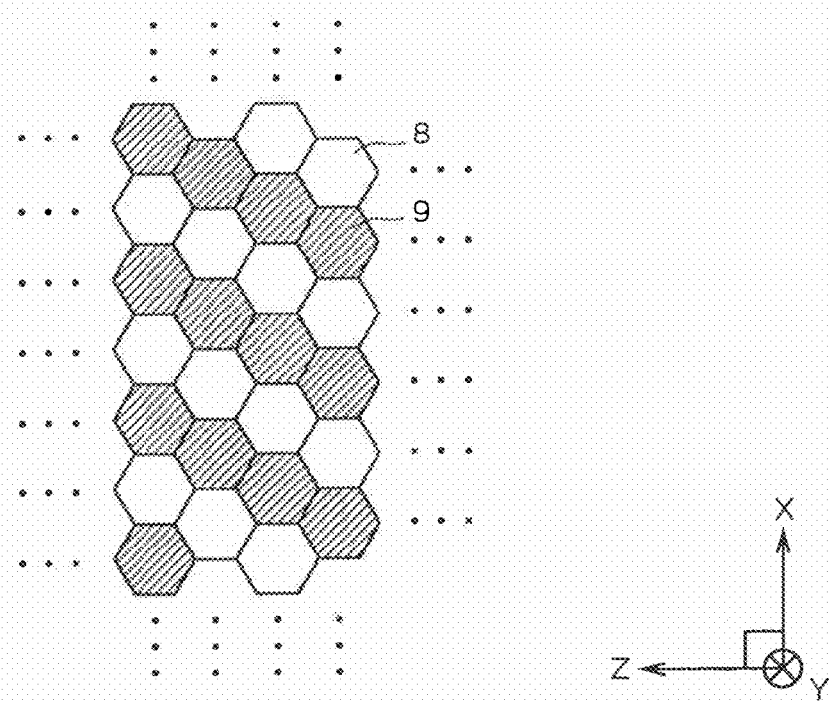
Figure 40:
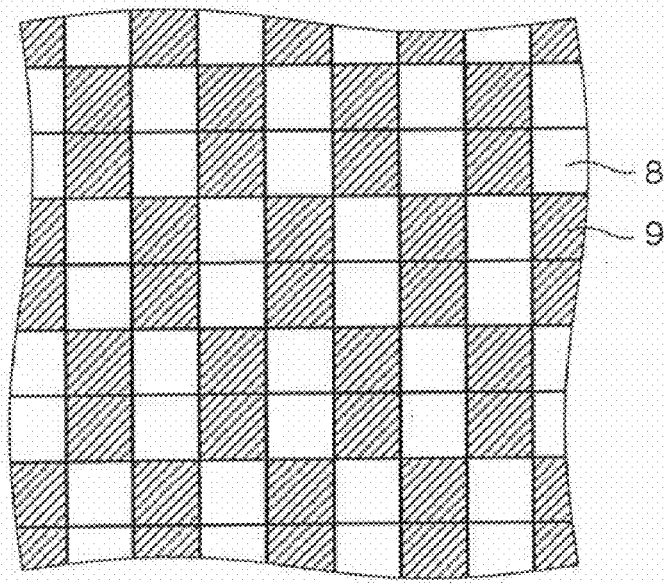
Figure 41:
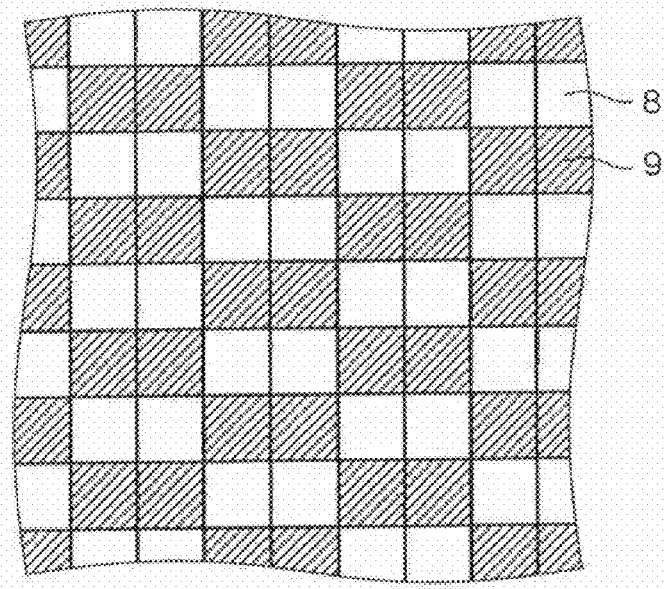
Figure 46:
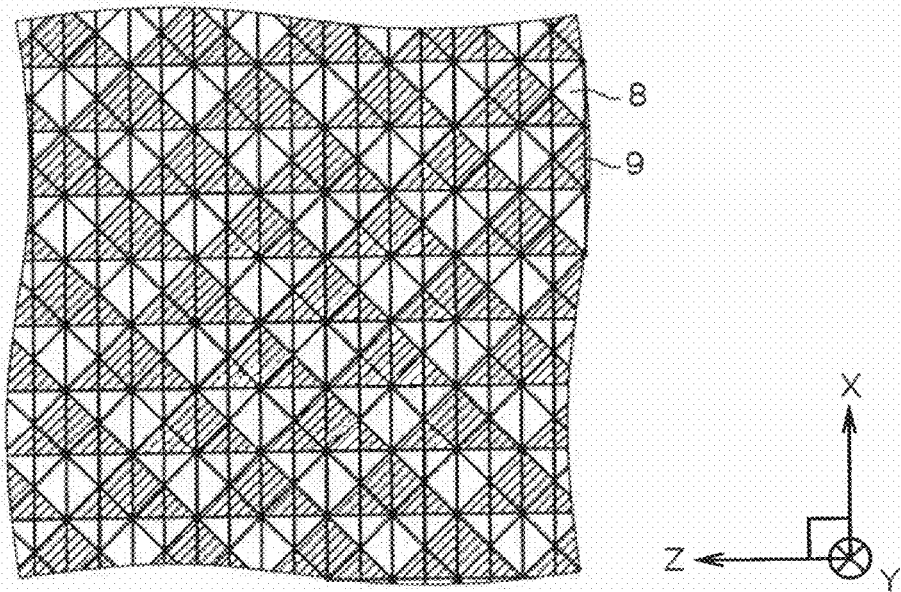
Figure 47:
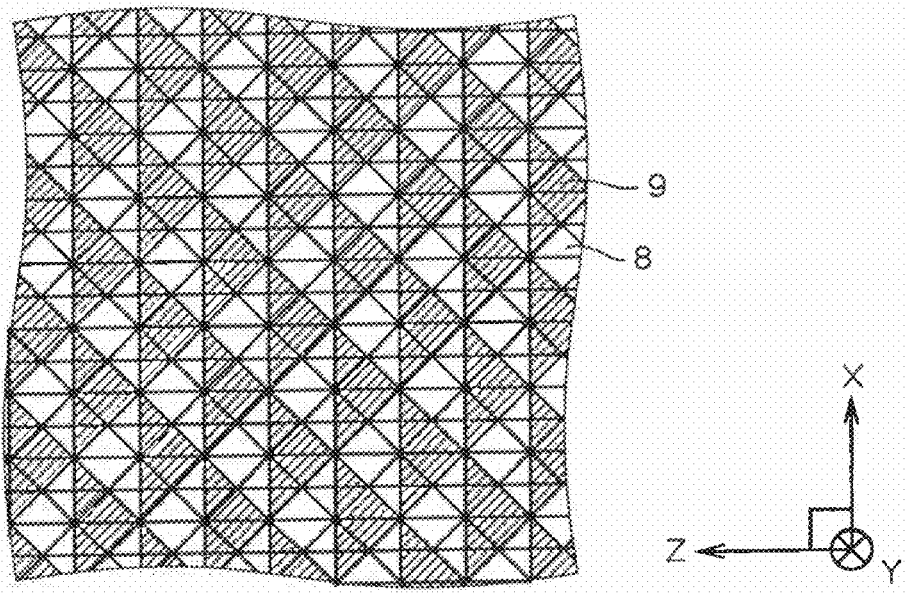
Figure 48:
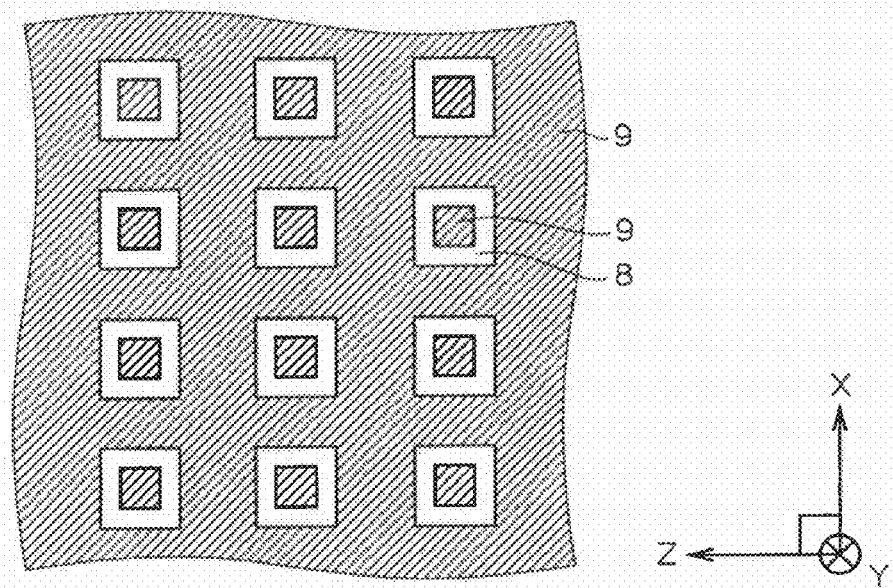
Figure 49:
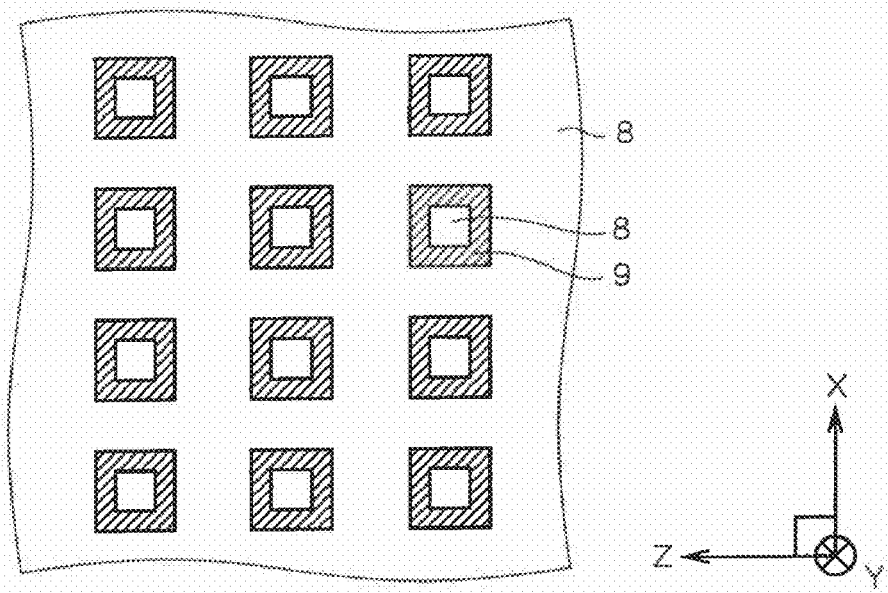
Figure 52:
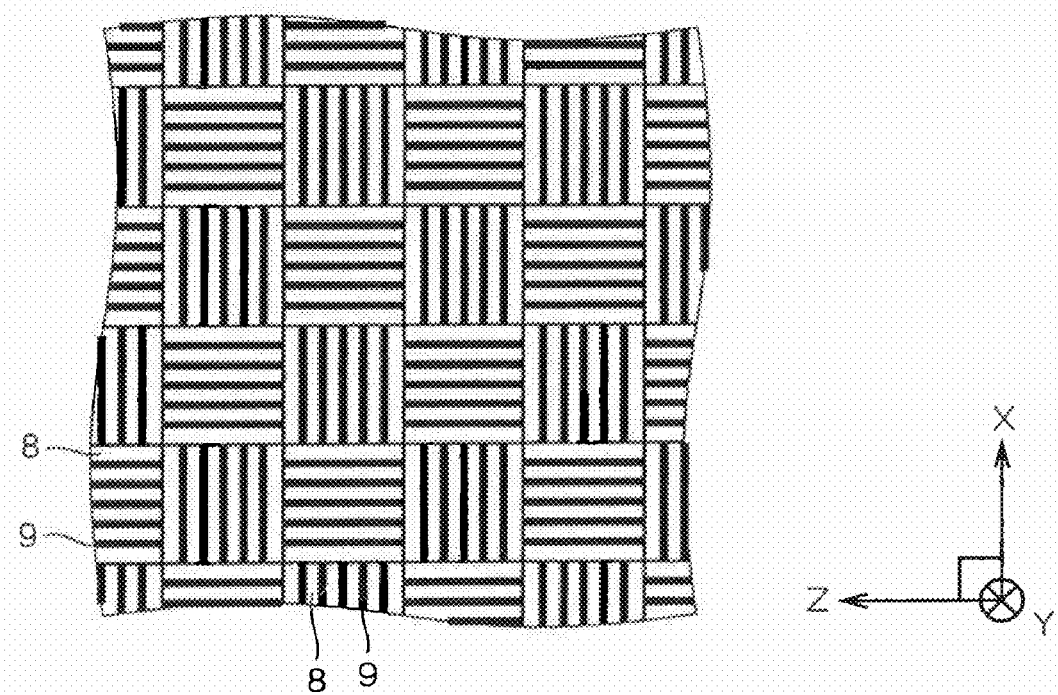

FIG. 28 shows a specific example of positional relationship of the layers 8 and 9 in which the layers 8 and 9 are arranged in a first stripe pattern. More specifically, the layers 8 and the layers 9 each of which extends along a horizontal direction Z of the drawing sheet of FIG. 28 are alternately disposed so as to form the first strip pattern. A longitudinal sectional view taken along a line I-II in FIG. 28 corresponds to the longitudinal sectional view of FIG. 2, for example. FIG. 29 shows a specific example of positional relationship of the layers 8 and 9 in which the layers 8 and 9 are arranged in a second stripe pattern. More specifically, in contrast to the positional relationship shown in FIG. 28, the layers 8 and the layers 9 each of which extends along a vertical direction X of the drawing sheet of the FIG. 29 are alternately disposed so as to form the second stripe pattern. FIG. 30 shows a specific example of positional relationship of the layers 8 and 9 in which the layers 8 and 9 are arranged in a first checkerboard pattern. More specifically, the layers 8 and 9 each of which is square-shaped are alternately disposed along the vertical direction X and the horizontal direction Z. FIG. 31 shows a specific example of positional relationship of the layers 8 and 9, which is a modification of the specific example shown in FIG. 30. In the example shown in FIG. 31, the layers 8 and 9 are arranged in a second checkerboard pattern. In the second checkerboard pattern, each of the layers 8 and 9 is inclined at an arbitrary angle θ relative to the horizontal direction Z. FIG. 32 shows a specific example of positional relationship of the layers 8 and 9 in which the layers 8 and 9 are arranged in a first island pattern. More specifically, rectangular islands each including an N-type layer 8 are provided in a P-type layer 9. FIG. 33 shows a specific example of positional relationship of the layers 8 and 9 in which the layers 8 and 9 are arranged in a second island pattern having features opposite to those of the first island pattern. More specifically, rectangular islands each including a P-type layer 9 are provided in an N-type layer 8. FIG. 34 shows a specific example of positional relationship of the layers 8 and 9 in which the layers 8 and 9 are arranged in a third island pattern. More specifically, islands each of which includes an N-type layer 8 and has an arbitrary shape such as a circular shape, for example, are provided in a P-type layer 9. FIG. 35 shows a specific example of positional relationship of the layers 8 and 9 in which the layers 8 and 9 are arranged in a fourth island pattern having features opposite to those of the third island pattern. More specifically, islands each of which includes a P-type layer 9 and has an arbitrary shape such as a circular shape, for example, are provided in an N-type layer 8. FIG. 36 shows a specific example of positional relationship of the layers 8 and 9 in which a plurality of cells of the layers 8 and 9 are arranged in a first honeycomb pattern. In the example shown in FIG. 36, P-type layers 9 and N-type layers 8 are alternately disposed so as to form an almost stripe pattern including stripes running substantially along the horizontal direction Z. FIG. 37 shows a specific example of positional relationship of the layers 8 and 9 in which a plurality of cells of the layers 8 and 9 are arranged in a second honeycomb pattern. In the example shown in FIG. 37, P-type layers 9 and N-type layers 8 are alternately disposed so as to form an almost stripe pattern including stripes running substantially along the vertical direction X. FIG. 38 shows a specific example of positional relationship of the layers 8 and 9 in which a plurality of cells of the layers 8 and 9 are arranged in a third honeycomb pattern. In the example shown in FIG. 38, each of alternate P-type layers 9 and N-type layers 8 is inclined at an angle of +45 degrees in a counterclockwise direction relative to the horizontal direction Z. FIG. 39 shows a specific example of positional relationship of the layers 8 and 9 in which a plurality of cells of the layers 8 and 9 are arranged in fourth honeycomb pattern. In the example shown in FIG. 39, each of alternate P-type layers 9 and N-type layers 8 is inclined at an angle of −45 degrees in a counterclockwise direction, in other words, inclined at an angle of +45 degrees in a clockwise direction, relative to the horizontal direction Z. FIG. 40 shows a specific example of the layers 8 and 9 in which the layers 8 and 9 are arranged in a third checkerboard pattern. More specifically, the layers 8 and 9 each of which is rectangular are alternately disposed along the vertical direction X and the horizontal direction Z. FIG. 41 shows a specific example of the layers 8 and 9 in which the layers 8 and 9 are arranged in a fourth checkerboard pattern. More specifically, the layers 8 and 9 each of which is rectangular are alternately disposed along the vertical direction X and the horizontal direction Z. FIG. 42 shows a specific example of positional relationship of the layers 8 and 9 in which the layers 8 and 9 are arranged in a fifth checkerboard pattern. More specifically, some of the layers 8 and 9 each of which is rectangular are alternately disposed along the horizontal direction Z to form a plurality of thick horizontal layer lines each including alternate layers 8 and 9. Also, the others of the layers 8 and 9 each of which is square-shaped are alternately disposed along the horizontal direction Z to form a plurality of thin horizontal layer lines each including alternate layers 8 and 9. Each of the plurality of thin horizontal layer lines is disposed between two thick horizontal layer lines. FIG. 43 shows a specific example of positional relationship of the layers 8 and 9 in which the layers 8 and 9 are arranged in a sixth checkerboard pattern. More specifically, some of the layers 8 and 9 each of which is rectangular are alternately disposed along the vertical direction X to form a plurality of thick vertical layer lines each including alternate layers 8 and 9. Also, the others of the layers 8 and 9 each of which is square-shaped are alternately disposed along the vertical direction X to form a plurality of thin vertical layer lines each including alternate layers 8 and 9. Each of the plurality of thin vertical layer lines is disposed between two thick vertical layer lines. FIG. 44 shows a specific example of positional relationship of the layers 8 and 9 in which the layers 8 and 9 are arranged in a first combination pattern. In the example shown in FIG. 44, each of N-type layers 8 is octagon-shaped and each of P-type layers 9 is square-shaped. FIG. 45 shows a specific example of positional relationship of the layers 8 and 9 in which the layers 8 and 9 are arranged in a second combination pattern having features opposite to the first combination pattern shown in FIG. 44. In the example shown in FIG. 45, each of P-type layers 9 is octagon-shaped and each of N-type layers 8 is square-shaped. FIG. 46 shows a specific example of positional relationship of the layers 8 and 9 in which the layers 8 and 9 are arranged in a first triangle pattern. More specifically, each of the layers 8 and 9 is triangle-shaped with a base thereof extending along the horizontal direction Z. FIG. 47 shows a specific example of positional relationship of the layers 8 and 9 in which the layers 8 and 9 are arranged in a second triangle pattern. More specifically, in contrast to the positional relationship shown in FIG. 46, each of the layers 8 and 9 is triangle-shaped with a base thereof extending along the vertical direction X. FIG. 48 shows a specific example of positional relationship of the layers 8 and 9 in which the layers 8 and 9 are arranged in a first rectangular island pattern. More specifically, a plurality of unit cells each of which is rectangular and includes an island of an N-type layer 8 surrounding a P-type layer 9 are provided throughout a P-type layer 9. FIG. 49 shows a specific example of positional relationship of the layers 8 and 9 in which the layers 8 and 9 are arranged in a second rectangular island pattern. More specifically, in contrast to the positional relationship shown in FIG. 48, a plurality of unit cells each of which is rectangular and includes an island of a P-type layer 9 surrounding an N-type layer 8 are provided throughout an N-type layer 8. FIG. 50 shows a specific example of positional relationship of the layers 8 and 9 in which the layers 8 and 9 are arranged in a first circular island pattern. More specifically, a plurality of unit cells each of which is circular and includes an island of an N-type layer 8 surrounding a P-type layer 9 are provided throughout a P-type layer 9. FIG. 51 shows a specific example of positional relationship of the layers 8 and 9 in which the layers 8 and 9 are arranged in a second circular island pattern. More specifically, in contrast to the positional relationship shown in FIG. 50, a plurality of unit cells each of which is circular and includes an island of a P-type layer 9 surrounding an N-type layer 8 are provided throughout an N-type layer 8. In a specific example of positional relationship of the layers 8 and 9 shown in FIG. 52, first unit cells and second unit cells are provided. In each of the first unit cells, N-type layers 8 and P-type layers 9 each of which extends along the vertical direction X are alternately disposed so as to form a stripe pattern, locally. In each of the second unit cells, N-type layers 8 and P-type layers 9 each of which extends along the horizontal direction Z are alternately disposed so as to form a stripe pattern, locally. The first unit cells and the second unit cells are alternately disposed along the vertical direction X and the horizontal direction Z, to form a checkerboard pattern as a whole.

While the invention has been shown and described in detail, the foregoing description is in all aspects illustrative and not restrictive. It is therefore understood that numerous modifications and variations can be devised without departing from the scope of the invention.

What is claimed is:

1. An insulated gate bipolar transistor comprising:
a semiconductor substrate of a first conductivity type including a first main surface and a second main surface;
an insulated gate transistor formed in a region of said semiconductor substrate on a side of said semiconductor substrate where said first main surface is included, said insulated gate transistor including a channel of said first conductivity type which is formed within a base region of a second conductivity type during an on state of said insulated gate transistor, said base region extending from said first main surface toward an interior of said semiconductor substrate;
a first main electrode formed on said first main surface and being in contact with said base region of said insulated gate transistor at said first main surface;
a first semiconductor layer of said first conductivity type formed on said second main surface of said semiconductor substrate, facing said insulated gate transistor;
a second semiconductor layer of said second conductivity type formed on said second main surface of said semiconductor substrate, facing said insulated gate transistor, and vertically aligned with a region of the first main electrode in contact with said base region such that a center of the region of the first main electrode in contact with said base region is vertically aligned with a center of the second semiconductor layer; and
a second main electrode formed on said first semiconductor layer and said second semiconductor layer,
wherein an interface between said second main electrode and each of said first semiconductor layer and said second semiconductor layer is parallel to said first main surface,
a distance between said first main surface and said interface is equal to 200 μm or smaller, and
a thickness of each of said first semiconductor layer and said second semiconductor layer is equal to 2 μm or smaller.

2. An inverter circuit comprising plural insulated gate bipolar transistors each included on a single chip and each of the insulated gate bipolar transistors comprising:

a semiconductor substrate of a first conductivity type including a first main surface and a second main surface;

an insulated gate transistor formed in a region of said semiconductor substrate on a side of said semiconductor substrate where said first main surface is included, said insulated gate transistor including a channel of said first conductivity type which is formed within a base region of a second conductivity type during an on state of said insulated gate transistor, said base region extending from said first main surface toward an interior of said semiconductor substrate;

a first main electrode formed on said first main surface and being in contact with said base region of said insulated gate transistor at said first main surface;

a first semiconductor layer of said first conductivity type formed on said second main surface of said semiconductor substrate, facing said insulated gate transistor;

a second semiconductor layer of said second conductivity type formed on said second main surface of said semiconductor substrate, facing said insulated gate transistor, and vertically aligned with a region of the first main electrode in contact with said base region such that a center of the region of the first main electrode in contact with said base region is vertically aligned with a center of the second semiconductor layer; and a second main electrode formed on said first semiconductor layer and said second semiconductor layer, wherein an interface between said second main electrode and each of said first semiconductor layer and said second semiconductor layer is parallel to said first main surface, a distance between said first main surface and said interface is equal to 200 μm or smaller, and a thickness of each of said first semiconductor layer and said second semiconductor layer is equal to 2 μm or smaller.

* * * * *